(12) United States Patent
Campbell et al.

(10) Patent No.: US 12,119,535 B2
(45) Date of Patent: *Oct. 15, 2024

(54) AUTOMATED FEED SOURCE CHANGER FOR A COMPACT TEST RANGE

(71) Applicant: Orbit Advanced Technologies, Inc., Warminster, PA (US)

(72) Inventors: William Campbell, Doylestown, PA (US); Thomas McKeown, Medford, NJ (US); Per Iversen, Doylestown, PA (US); Thomas D. Kauffman, Glenside, PA (US); Zachary J. Pelli, Philadelphia, PA (US); Thomas P. O'Donnell, Philadelphia, PA (US)

(73) Assignee: Orbit Advanced Technologies, Inc., Warminster, PA (US)

( * ) Notice: Subject to any disclaimer, the term of this patent is extended or adjusted under 35 U.S.C. 154(b) by 157 days.

This patent is subject to a terminal disclaimer.

(21) Appl. No.: 17/713,293

(22) Filed: Apr. 5, 2022

(65) Prior Publication Data

US 2022/0231397 A1     Jul. 21, 2022

Related U.S. Application Data

(63) Continuation of application No. 17/065,570, filed on Oct. 8, 2020, now Pat. No. 11,335,988, which is a (Continued)

(51) Int. Cl.
    *H01Q 1/02*            (2006.01)
    *H01Q 21/20*         (2006.01)

(52) U.S. Cl.
    CPC ............ *H01Q 1/02* (2013.01); *H01Q 21/20* (2013.01)

(58) Field of Classification Search
    CPC ................................ H01Q 1/02; H01Q 21/20
    See application file for complete search history.

(56) References Cited

U.S. PATENT DOCUMENTS

| | | | |
|---|---|---|---|
| 10,749,247 B2* | 8/2020 | Tornatta, Jr. | ............. H01Q 5/30 |
| 10,898,102 B2* | 1/2021 | Saroka | ..................... A61B 5/05 |
| 11,335,988 B2* | 5/2022 | Campbell | ............. H01Q 21/20 |

FOREIGN PATENT DOCUMENTS

CN            107479040      * 12/2017         G01S 7/40

* cited by examiner

*Primary Examiner* — Tuan H Nguyen
(74) *Attorney, Agent, or Firm* — Michael Crilly, Esquire

(57) ABSTRACT

A mechanical means for deploying one of two or more feed sources within a test range is presented. The feed source selected for testing is properly positioned for use within the range by rotating one of two or more arms to an upright and locked position. An arm may further include a rotatable antenna wheel with two or more feed sources thereon whereby a selected feed source is rotated into position via the antenna wheel. The antenna wheel includes a center body, feed sources attached to the center body and aligned along a rotational plane, and a shroud disposed about the center body and feed sources. The antenna wheel may include a cooling system for managing heat generated by the feed sources and electronics therefore. In preferred embodiments, the feed source changer is mounted within the range so that a selected feed source communicates an emitted beam onto a reflector which is redirected as a reflected beam toward a device under test. Concealment panel(s) may be positioned adjacent to the feed source changer to minimize electromagnetic reflections therefrom.

21 Claims, 21 Drawing Sheets

Related U.S. Application Data continuation of application No. 16/611,327, filed as application No. PCT/US2019/018393 on Feb. 18, 2019, now Pat. No. 10,886,592.

(60) Provisional application No. 62/777,918, filed on Dec. 11, 2018.

AUTOMATED FEED SOURCE CHANGER FOR A COMPACT TEST RANGE

CROSS REFERENCE TO RELATED APPLICATIONS

This application is a continuation of U.S. patent application Ser. No. 17/065,570 filed Oct. 8, 2020 which a continuation of U.S. patent application Ser. No. 16/611,327 filed Nov. 6, 2019 now U.S. Pat. No. 10,886,592 issued Jan. 5, 2021 which is a National Phase Entry of PCT Application No. PCT/US2019/018393 filed Feb. 18, 2019 which claims benefit of U.S. Provisional Application No. 62/777,918 filed Dec. 11, 2018, each application entitled Automated Feed Source Changer for a Compact Test Range. The subject matters of the prior applications are incorporated in their entirety herein by reference thereto.

GOVERNMENT SPONSORED RESEARCH AND DEVELOPMENT

None.

BACKGROUND OF THE INVENTION

1. Field of the Invention

The invention generally relates to a test range and more particularly is concerned, for example, with a feed changer facilitating selection and/or placement of an antenna feed source within a chamber adapted to assess the electromagnetic characteristics of a device under test. Specifically, the invention is an automated feed source changer including at least two arms rotatable about a base wherein one arm includes a rotatable antenna wheel with two or more feed sources thereon and another arm(s) includes either a single feed source or another multi-source antenna wheel. The invention may include features which mitigate electromagnetic reflections from an antenna wheel, cool feed sources within an antenna wheel, or conceal portions of a feed source changer.

2. Background

A variety of compact test ranges are known within the art. Many ranges include a single feed source that emits non-planar electromagnetic waves which impinge a reflector and thereafter redirected as a planar-shaped wavefront in the direction of a device under test. The single feed source is secured to the floor of the test range for proper placement and operability so as to permit testing within a specific frequency band. The single feed source must be removed and replaced by another feed source before testing another frequency band. The end result is a labor-intensive effort whereby one feed source is removed from the test range and a replacement feed source is properly positioned, aimed, and secured within the range.

Zhang in Chinese Patent No. 107479040 addresses challenges posed by a single feed source. Specifically, Zhang teaches a turntable with two feed sources fixed thereto whereby the turntable is positioned at an oblique angle within a test range. The orientation of the turntable allows the feed sources to rotate in a plane offset from the plane of the reflector. Although Zhang facilitates a multi-source solution, placement of feed sources along the front face of an obliquely orientated turntable is prone to reflections detrimental to measurements within a test range. Furthermore, Zhang does not address other factors detrimental to measurements within a compact test range, examples including, but not limited to, heat released by feed sources and reflective surfaces associated with mounting a structure with multiple feed sources thereon within a test range.

As is readily apparent from the discussions above, the related arts do not provide a means which permit for the automated selection and placement of one of several feed sources and which also minimize reflections and other conditions detrimental to measurement of the electromagnetic characteristics of a device under test within a compact test range.

Accordingly, what is required is an automated means for selection and placement of one of several feed sources within a compact test range which avoids one or more problems inherent to the prior art.

SUMMARY OF THE INVENTION

An object of the invention is an automated means for selection and placement of one of several feed sources within a compact test range which avoids one or more problems inherent to the prior art.

In accordance with embodiments of a compact test range, the range includes a feed source changer, a reflector, and a pylon. The feed source changer further includes a plurality of feed sources, a pair of arms rotatable so that one arm is substantially horizontal when another arm is substantially vertical, and an antenna wheel rotatably mounted to one arm. Two or more feed sources are circumferentially mounted about the antenna wheel. The antenna wheel is rotatable within a rotational plane substantially perpendicular to the reflector. The pylon is adapted to receive a device under test. Each feed source is disposed along the antenna wheel so that an emitted beam from one of the feed sources is redirected by the reflector as a reflected beam toward the device under test. The reflected beam is more planar shaped than the emitted beam.

In accordance with other embodiments of a compact test range, each feed source has a source point whereby each source point is positionable to an activation point via the feed source changer so that the emitted beam is properly aimed with respect to the reflector.

In accordance with other embodiments of a compact test range, one feed source is fixed to another of the arms.

In accordance with other embodiments of a compact test range, a second antenna wheel is mounted to another of the arms.

In accordance with other embodiments of a compact test range, the arms are arranged to define a first angle which is perpendicular.

In accordance with other embodiments of a compact test range, the arms are arranged to define a second angle which is oblique.

In accordance with other embodiments of a compact test range, an elevation positioner is disposed between the pair of arms and the base so that the arms are rotatable about the base within an elevational plane.

In accordance with other embodiments of a compact test range, a rotation positioner is disposed between the antenna wheel and the arm so that the antenna wheel is rotatable with respect to the arm within the rotational plane.

In accordance with other embodiments of a compact test range, a third arm includes either another antenna wheel or another feed source thereon. The third arm is fixed to the pair of arms so that the third arm and one of the pair of arms are rotatable within a plane perpendicular to an elevational plane within which the pair of arms rotates.

In accordance with other embodiments of a compact test range, an antenna positioner is disposed between the feed source and a center body within the antenna wheel.

In accordance with other embodiments of a compact test range, the antenna wheel includes a center body with at least one plenum and at least one electronics module. The plenum is adapted to receive an airflow which passes across the feed source(s) or the electronics module(s). The plenum communicates with a duct which vents the airflow from the antenna wheel.

In accordance with other embodiments of a compact test range, a fan causes an airflow to move into and out of the antenna wheel.

In accordance with other embodiments of a compact test range, a sensor measures temperature of an airflow which passes through the antenna wheel.

In accordance with other embodiments of a compact test range, the antenna wheel includes a shroud which mitigates electromagnetic reflections.

In accordance with other embodiments of a compact test range, a concealment panel is disposed adjacent to the feed source changer so that the concealment panel mitigates electromagnetic reflections within the compact test range.

In accordance with other embodiments of a compact test range, the feed source changer is disposed within a pit which minimizes electromagnetic reflections from the horizontally disposed arm and at least a portion of the vertically disposed arm.

In accordance with other embodiments of a compact test range, the feed source changer is disposed within a pit with at least one concealment panel which is rotatably operable between OPEN and CLOSED positions.

In accordance with other embodiments of a compact test range, the feed source changer is disposed within a pit with at least one concealment panel which is slidably operable between OPEN and CLOSED positions.

In accordance with other embodiments of a compact test range, the feed source changer is disposed within a pit with at least one concealment panel which is extendably operable between OPEN and CLOSED positions.

In accordance with embodiments of a feed source changer, the feed source changer includes a first arm, a second arm, and an antenna wheel with a plurality of feed sources thereon. The second arm is fixed to the first arm. Both arms are rotatable so that one is substantially horizontal when another is substantially vertical. The antenna wheel is rotatably mounted to one of the arms. The antenna wheel includes a shroud disposed about a center body. At least two feed sources are circumferentially mounted to and aligned along a rotational plane of the center body.

In accordance with other embodiments of a feed source changer, each feed source has a source point. The source point is positioned at an activation point so that the feed source is properly located within the test range.

In accordance with other embodiments of a feed source changer, another antenna wheel is mounted to another of the arms.

In accordance with other embodiments of a feed source changer, another feed source is fixed to another of the arms.

In accordance with other embodiments of a feed source changer, the arms are arranged to define a first angle which is perpendicular.

In accordance with other embodiments of a feed source changer, the arms are arranged to define a second angle which is oblique.

In accordance with other embodiments of a feed source changer, an elevation positioner rotates the arms within an elevational plane.

In accordance with other embodiments of a feed source changer, a rotation positioner rotates the antenna wheel within the rotational plane.

In accordance with other embodiments of a feed source changer, a third arm has either another antenna wheel or another feed source mounted thereon whereby the third arm and one of the arms are rotatable within a plane that intersects an elevational plane within which the pair of arms rotates.

In accordance with other embodiments of a feed source changer, an antenna positioner is disposed between a feed source and the center body.

In accordance with other embodiments of a feed source changer, the center body include at least one plenum and at least one electronics module therein. The plenum is adapted to receive an airflow which passes across the feed source(s) or the electronics module(s). The plenum has a duct which vents the airflow out of the antenna wheel.

In accordance with other embodiments of a feed source changer, a fan causes an airflow to move into and out of the antenna wheel.

In accordance with other embodiments of a feed source changer, a sensor measures temperature of an airflow which passes through the antenna wheel.

In accordance with other embodiments of a feed source changer, the shroud mitigates electromagnetic reflections.

In accordance with other embodiments of a feed source changer, a base is disposed between a floor and the arms whereby the arms are rotatable with respect to the base.

In accordance with other embodiments of a feed source changer, the feed source changer is disposed within a pit.

In accordance with embodiments of an antenna wheel, the antenna wheel includes a center body, at least two feed sources, a shroud, and a rotation positioner. The feed sources are mounted to and aligned along a rotational plane of the center body. The shroud is disposed about the center body. The rotation positioner is mounted at one end to the center body so as to extend through the shroud.

In accordance with other embodiments of an antenna wheel, each feed source has a source point which is positionable to an activation point via the rotation positioner.

In accordance with other embodiments of an antenna wheel, the antenna wheel is rotatably mounted to an arm.

In accordance with other embodiments of an antenna wheel, an antenna positioner is disposed between the feed source and the center body.

In accordance with other embodiments of an antenna wheel, the center body includes at least one plenum and at least one electronics module. The plenum is adapted to receive an airflow which passes across the feed source(s) or the electronics module(s).

In accordance with other embodiments of an antenna wheel, a fan causes the airflow to move into and out of the antenna wheel so as to cool the feed source(s) or the electronics module(s).

In accordance with other embodiments of an antenna wheel, a sensor measures temperature of the airflow for operability of the fan.

In accordance with other embodiments of an antenna wheel, the shroud includes at least one material which mitigates electromagnetic reflections.

In accordance with other embodiments of an antenna wheel, the shroud includes a ridge disposed between a pair of sides.

In accordance with other embodiments of an antenna wheel, the shroud includes a pair of facets disposed about each feed source whereby each facet is disposed between the ridge and one of the sides.

In accordance with other embodiments of an antenna wheel, the facets cooperate to minimize electromagnetic reflections directed toward a device under test.

In accordance with other embodiments of an antenna wheel, an access panel is removably attached to the shroud.

In accordance with other embodiments of an antenna wheel, the feed source extends through the shroud.

In accordance with other embodiments of an antenna wheel, the rotation positioner is mounted at another end to an arm.

In accordance with embodiments of a cooling system for an antenna wheel, the system includes an airflow, a plenum, a first duct, a second duct, and a cooling unit. The airflow is disposed within the antenna wheel. The plenum is disposed within a center body of the antenna wheel. At least two feed sources are mounted to and aligned along a rotational plane of the center body. A shroud is disposed about the center body and each feed source. The first duct directs the airflow after passing across the feed source into the plenum. The second duct directs the airflow out of the plenum. The cooling unit is adapted to receive the airflow from the second duct.

In accordance with other embodiments of a cooling system, the center body includes at least one electronics module adjacent to the plenum. The airflow passes across the electronics module(s) before entering the plenum.

In accordance with other embodiments of a cooling system, the airflow passes through a perforated plate before passing across the electronics module(s).

In accordance with other embodiments of a cooling system, a fan is disposed within or adjacent to at least one of the plenum, the feed source, the electronics module, and the cooling unit.

In accordance with other embodiments of a cooling system, a sensor is disposed within or adjacent to at least one of the fan, the feed source, the plenum, the electronics module, and the cooling unit whereby the sensor measures a parameter indicative of at least one of cooling or heating.

In accordance with other embodiments of a cooling system, the sensor communicates with the fan to adjust operation of the fan.

In accordance with other embodiments of a cooling system, the sensor communicates with a temperature controller which adjusts operation of the fan.

In accordance with other embodiments of a cooling system, the antenna wheel is mounted to an arm via a rotation positioner.

In accordance with other embodiments of a cooling system, the second duct passes through the arm.

In accordance with other embodiments of a cooling system, the second duct passes through the rotation positioner.

In accordance with other embodiments of a cooling system, the arm is attached to a second arm. A third duct is mounted to the second arm and attached at one end to the second duct before the cooling unit.

In accordance with other embodiments of a cooling system, at least a portion of the second duct is adapted to permit movement of the arm.

In accordance with other embodiments of a cooling system, the airflow is vented into the test range by the cooling unit.

In accordance with other embodiments of a cooling system, the airflow is vented from the test range by the cooling unit.

In accordance with embodiments of a concealment system, the arrangement includes a feed source changer and at least one concealment panel. The feed source changer has a plurality of feed sources thereon. The feed source changer includes an arm rotatable between substantially horizontal and substantially vertical positions. An antenna wheel is rotatably mounted to the arm. At least two feed sources are mounted to the antenna wheel. The concealment panel(s) is/are disposed adjacent to the feed source changer. The concealment panel(s) minimizes electromagnetic reflections from the arm when horizontally disposed and at least a portion of the arm when vertically disposed.

In accordance with other embodiments of a concealment system, the feed source changer is mounted to a floor within a test range.

In accordance with other embodiments of a concealment system, the concealment panel(s) is/are mounted to a floor within a test range.

In accordance with other embodiments of a concealment system, the feed source changer is disposed within a pit.

In accordance with other embodiments of a concealment system, the concealment panel(s) is/are movable.

In accordance with other embodiments of a concealment system, the concealment panel(s) is/are rotatably operable between OPEN and CLOSED positions and the feed source changer is disposed within a pit.

In accordance with other embodiments of a concealment system, the concealment panel(s) is/are slidably operable between OPEN and CLOSED positions and the feed source changer is disposed within a pit.

In accordance with other embodiments of a concealment system, the concealment panel(s) is/are extendably operable between OPEN and CLOSED positions and the feed source changer is disposed within a pit.

In accordance with other embodiments of a concealment system, the arm is rotatable between substantially horizontal and substantially vertical positions when the concealment panel(s) is/are OPEN.

In accordance with other embodiments of a concealment system, the concealment panel(s) is/are operable between OPEN and CLOSED positions via an actuator.

In accordance with other embodiments of a concealment system, the concealment panel(s) is/are notched and the arm extends through an opening formed by the notch(es).

In accordance with other embodiments of a concealment system, at least one concealment panel is notched and one feed source communicates an emitted beam through an opening formed by the notch(es).

In accordance with other embodiments of a concealment system, the arm is rotatable between substantially horizontal and substantially vertical positions when the concealment panel(s) is/are CLOSED.

In preferred embodiments, the automated feed source changer minimizes radar reflections while facilitating selection of one of several primary frequency bands of operation, non-limiting examples being in the range from 0.1 GHz to 40 GHz, or one low frequency band, non-limiting examples being in the range from 0.1 GHz to 1.5 GHz. The automated feed source changer is configured so that the primary frequency feed sources are mounted on an antenna wheel rotatably mounted to one arm and the low frequency feed source is fixedly mounted to another arm. The arms are fixedly attached to form a dual-arm assembly whereby one arm is deployed in a substantially vertical orientation when the other arm is disposed in a substantially horizontal orientation with respect to the floor of a test range. An elevation positioner rotates the dual-arm assembly so as to allow either the low frequency feed source or the primary frequency feed sources to be vertically deployed and properly positioned with respect to a reflector and a device under test. The primary feed sources are further rotatable within a substantially vertical plane by a roll-type rotation positioner. The rotational plane of the antenna wheel is oriented substantially perpendicular to the reflective plane of the reflector. The feed source selected for testing within the antenna wheel may be held in position by a pin lock or the like to ensure precision alignment with respect to a reflector and a device under test. The rotatable dual-arm assembly allows either the primary frequency feed sources or the low frequency feed source attached to the horizontally deployed arm to be shielded, concealed, or hidden behind absorber material(s) thus avoiding extraneous signal scattering within a test range.

In preferred embodiments, the antenna wheel and other components of the feed source changer are covered by an absorber treatment. The absorber treatment may be composed of a rubberized laminate capable of broadband absorption typically greater than −20 dB. In a non-limiting example, the laminate may include one or more layers of an open cell polyurethane foam impregnated and laminated with flexible adhesive and/or latex. The absorber treatment may be shaped so as to direct scatter away from the quiet zone within a test range.

In preferred embodiments, the absorber treatment with or without other components, such as sheet metal or other suitable material, may form a shroud about the antenna wheel. The antenna wheel may include one or more access panels disposed along the shroud to either side of a feed source. The access panels are positioned along the antenna wheel to permit access to the feed sources and electronics therefore. Each access panel may include at least one dielectric handle facilitating removal and reattachment of a panel with respect to the shroud. Access panels are located along the antenna wheel so as to be accessible at ground level thus avoiding the need for a ladder or a lift.

In preferred embodiments, the feed sources and electronics therefore are secured to the center body of the antenna wheel. This arrangement facilitates a compact profile which minimizes both radar cross section and signature of the antenna wheel thus minimizing losses and scatter which might adversely affect measurements within a test range.

In preferred embodiments, the temperature of feed sources and electronics therefore within the antenna wheel are regulated by a forced-air cooling system within a narrow band, a non-limiting example being ±2 degrees Fahrenheit. The cooling system draws ambient air through inlets along the shroud and into the antenna wheel. The air enters one or more plenums after passing over or through feed sources and electronics therefore. A feed source may utilize an intake on the front end of the transmitter/receiver head thereof. After passing over or through the feed source, the heated air enters a plenum within the center body of the antenna wheel via a duct. After passing over or through the electronics, the heated air also enters the plenum within the center body. The electronics are housed within a rack portion of the center body in contact with the plenum thereby allowing the heated air to directly enter the plenum. The heated air then exits the plenum via another duct and thereafter passes into a cooling unit. The cooling unit may expel the heated air either inside or outside of the test range at a location that does not interfere with measurements within the quiet zone.

In preferred embodiments, one or more fans may be required to draw air into the antenna wheel, to pass the air over feed sources and electronics, and/or to expel the heated air. One or more sensors, one non-limiting example being a thermocouple, may be mounted within the antenna wheel on or adjacent to a feed source and/or electronics therefore so as to monitor temperature(s). Temperature data may be used to adjust the speed of one or more fans so as to regulate airflow within the antenna wheel and about the feed source changer, thereby maintaining temperature(s) conducive to performance.

In preferred embodiments, RF cables are insulated and routed within the center body so as to minimize cable lengths and to avoid pathways with heated airflow. Power and communication lines are routed through the rotation positioner which rotates the antenna wheel and/or through a service loop, thus avoiding mechanical flex by RF cables or the need for rotatory joints.

In preferred embodiments, the low-frequency feed source may include a shaped absorber shroud so as to minimize reflections into the quiet zone. Cabling to and from the low-frequency feed source is likewise oriented so as to minimize cable lengths, to avoid heated air, and to avoid flexing and rotatory joints. Heat management for the low-frequency feed source and electronics therefore may also include ducts with or without plenum to properly cool both components.

Several advantages are offered by one or more embodiments of the invention. The invention facilitates selection of one of several feed sources whereby the selected feed source is properly positioned and aimed with respect to a reflector so that the reflected waves form a planar wavefront which impinges a device under test. The invention avoids labor-intensive activities otherwise required to replace one feed source with another feed source within a test range. The invention minimizes reflections from an antenna wheel with multiple feed sources thereon which are otherwise detrimental to measurements within a quiet zone of a test range. The invention minimizes heat generated by an active feed source which might otherwise be released into a test range thereafter adversely affecting reflection and/or reception measurements within a test range. The invention minimizes reflections caused by components facilitating selection and placement of feed sources within a test range.

The above and other objectives, features, and advantages of the preferred embodiments of the invention will become apparent from the following description read in connection with the accompanying drawings, in which like reference numerals designate the same or similar elements.

BRIEF DESCRIPTION OF THE DRAWINGS

Additional aspects, features, and advantages of the invention will be understood and will become more readily apparent when the invention is considered in light of the following description made in conjunction with the accompanying drawings.

DETAILED DESCRIPTION OF THE INVENTION

Figure 1:
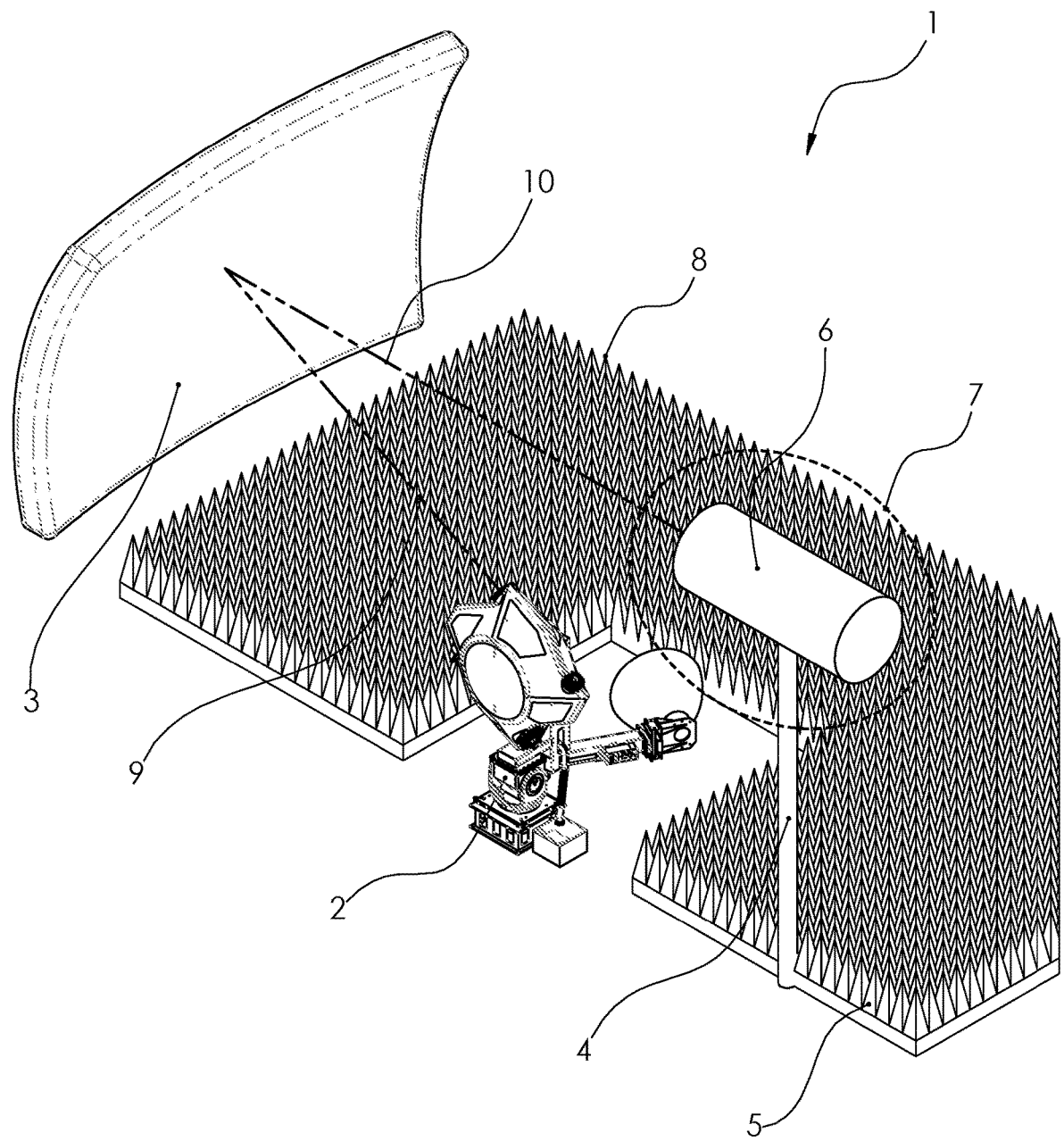
FIG. 1 is a perspective view illustrating a compact test range with a feed source changer including two arms wherein a rotatable antenna wheel with multiple feed sources is attached to one arm and a single feed source is fixed to another arm in accordance with an embodiment of the invention.

Reference will now be made in detail to several embodiments of the invention that are illustrated in the accompanying drawings. Wherever possible, same or similar reference numerals are used in the drawings and the description to refer to the same or like parts.

While features of various embodiments are separately described herein, it is understood that such features may be combinable to form other additional embodiments.

One or more components described herein may be manufactured via methods, processes, and techniques understood in the art, including, but not limited to, machining, molding, forming, and three-dimensional printing.

Referring now to FIG. 1, the test range 1 includes a feed source changer 2, a reflector 3, and a pylon 4, the latter sometimes referred to as a pedestal. The test range 1 is bounded by a floor 5, wall(s), and ceiling, the latter two features not shown. Absorbers 8 may be applied to the floor 5, wall(s), and ceiling to mitigate reflections with or without scattering by electromagnetic waves within the test range 1. The absorbers 8 may be composed of materials and/or shape(s) understood within the art which facilitate absorption and/or controlled reflection of electromagnetic waves. A non-limiting example for the absorber 8 is Model No. AEP48 by MVG (Microwave Vision Group).

Referring again to FIG. 1, absorbers 8 are disposed along the floor 5 adjacent to the feed source changer 2, the reflector 3, and the pylon 4. In preferred embodiments, absorbers 8 cover both the left side (not shown) and the right side of the floor 5 about the feed source changer 2, the reflector 3, and the pylon 4. In some embodiments, an area adjacent to the feed source changer 2 and/or the pylon 4 may not include absorbers 8 so as to facilitate a pathway.

Referring again to FIG. 1, the pylon 4 extends into the test range 1. The pylon 4 is understood to broadly include an element onto which a device under test 6 is mountable. The device under test 6 may include, but is not limited to, an aircraft, a ground vehicle, a watercraft, or a radar dish. The pylon 4 may be secured to the ceiling, wall, or the floor 5, the latter illustrated in FIG. 1. The device under test 6 is attached to one end of the pylon 4. The absorbers 8 along the floor 5, the walls, and the ceiling cooperate to minimize or otherwise prevent reflection of electromagnetic waves into a quiet zone 7 about the device under test 6. The arrangement of absorbers 8 minimizes electromagnetic waves which might impinge the device under test 6 thereby adversely affecting the assessment thereof.

Referring again to FIG. 1, the feed source changer 2 includes a feed source which directs electromagnetic waves as an emitted beam 9 toward the reflector 3 disposed at one end of the test range 1. The reflector 3 is understood to broadly include devices which reflect electromagnetic waves. The emitted beam 9 impinges the reflector 3 which then redirects the electromagnetic waves as a reflected beam 10 in the direction of the device under test 6 at another end of the test range 1. Reflective properties, absorption properties, and/or shape(s) of the reflector 3 condition the electromagnetic waves which impinge the reflector 3 so that the reflected beam 10 is less curved and more planar than the emitted beam 9. Although the test range 1 in FIG. 1 illustrates a compact range, it is understood that various embodiments of the feed source changer 2 and components thereof are applicable to other range types which may or may not include a reflector 3 and/or a pylon 4.

Figure 2A:
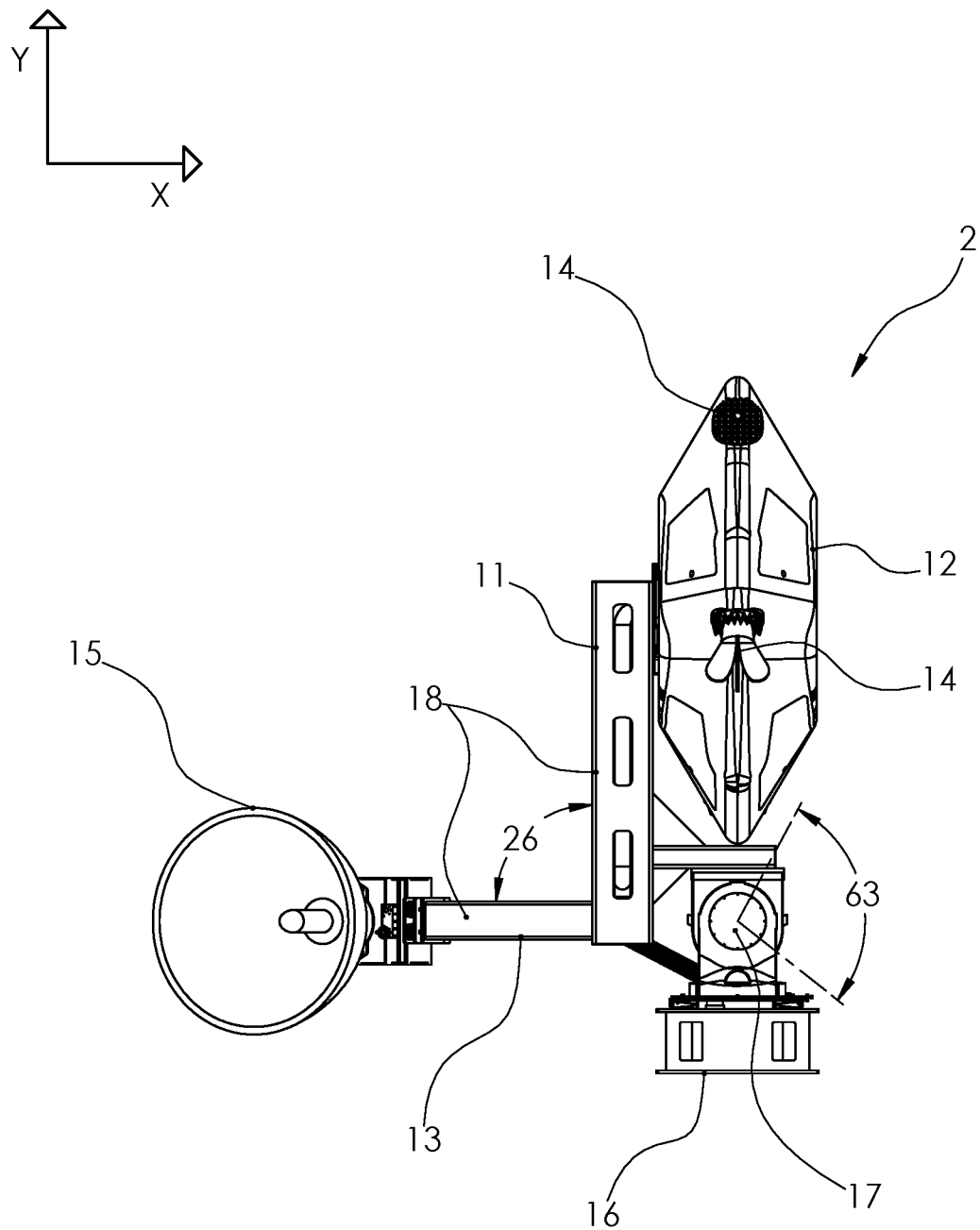
FIG. 2a is a front side view illustrating a feed source changer wherein a first arm and a second arm are disposed in a substantially perpendicular arrangement so that both arms are rotatable about a base, the first arm includes a rotatable antenna wheel with multiple feed sources thereon, and the second arm includes a single feed source fixed at one end thereof in accordance with an embodiment of the invention.

Referring now to FIG. 2a, the feed source changer 2 includes a pair of rotatable arms 11, 13 and an antenna wheel 12 with two or more feed sources 14. The arms 11, 13 are attached, preferably at one end thereof, to form a substantially L-shaped support structure 18. Substantially L-shaped is understood to also include an L-shaped arrangement. In preferred embodiments, the arms 11, 13 are disposed at a first angle 26 which is 90 degrees within the elevational plane 63 (x-y plane) of rotation, although other angles and arrangements are possible. The antenna wheel 12 is rotatably attached to one arm 13 or the other arm 11, the latter illustrated in FIG. 2a. In some embodiments, a single feed source 15 may be fixedly attached to the other arm 11 or 13 via a mount coupling 25 and a mounting flange 29, such as illustrated in FIG. 2d. The feed sources 14, 15 and 31, the latter shown in FIG. 2f, include devices known within the art which are capable of emitting electromagnetic radiation. A non-limiting exemplary feed source 14, 15, and/or 31 may include a feed element 38 and an antenna element 39 such as illustrated in FIG. 3c. Non-limiting examples for one or more feed sources 14, 15, 31 include Model Nos. QH100, QH500, and QH2000 by MVG (Microwave Vision Group).

Referring again to FIG. 2a, the arms 11, 13 are rotatable within the x-y plane about a base 16 secured along a surface within a test range 1. By way of example, the horizontally disposed arm 13 is positioned to the left of the vertically disposed arm 11 and the horizontally disposed arm 11 is positioned to the right of the vertically disposed arm 13 within the range of motion for both arms 11, 13. In preferred embodiments, the arms 11, 13 are secured to the base 16 via an elevation positioner 17. A non-limiting example for the elevation positioner 17 is Model No. AL-4385-1 by MVG-Orbit. The elevation positioner 17 controllably rotates the arms 11, 13 between vertical and horizontal positions within the x-y plane so that one arm 11 or 13 is substantially vertical when another arm 13 or 11 is substantially horizontal. Substantially vertical is understood to also include a vertical arrangement. Substantially horizontal is understood to also include a horizontal arrangement.

Figure 2B:
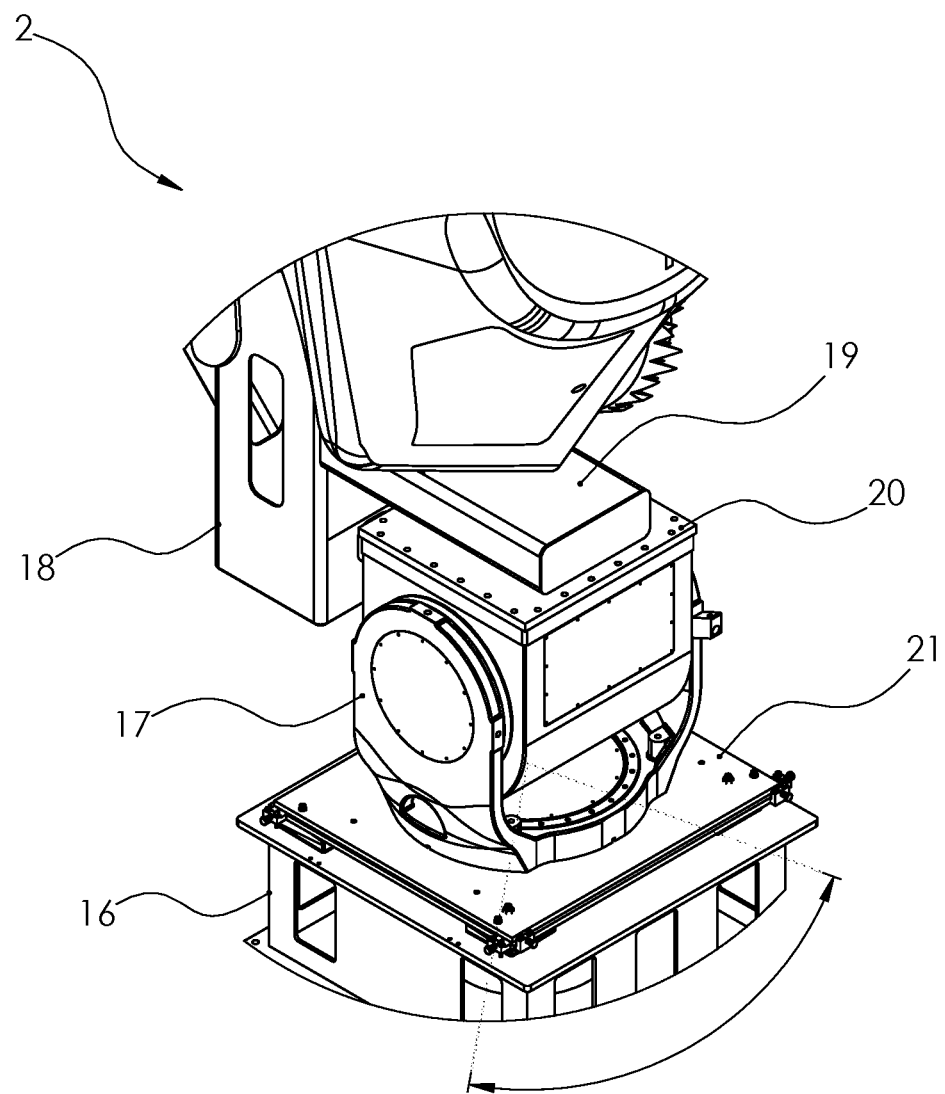
FIG. 2b is an enlarge view illustrating first and second arms rotatable with respect to a base via an elevation positioner in accordance with an embodiment of the invention.

Referring now to FIG. 2b, the support structure 18 may include a beam 19 which extends therefrom adjacent to the base 16. The beam 19 is mechanically secured to a mounting flange 20 at the elevation positioner 17. The elevation positioner 17 is mechanically secured to the base 16 at a mounting plate 21. The arrangement between the beam 19, the mounting flange 20, and the mounting plate 21 permits the arms 11, 13 of the feed source changer 2 to rotate with respect to the base 16 via the elevation positioner 17. In some embodiments, it may be advantageous for the support structure 18 to be rotatable in the plane to which the base 16 is mounted.

Figure 2C:
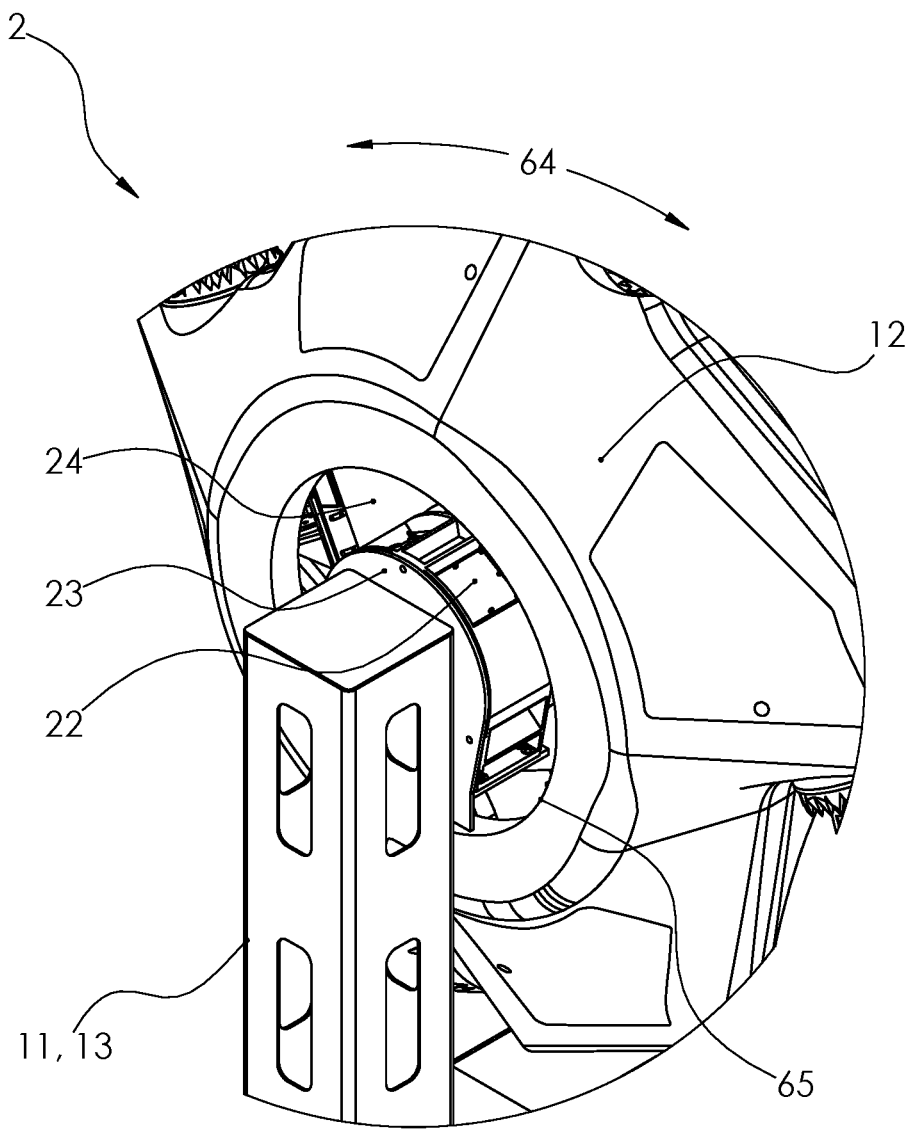
FIG. 2c is an enlarged view illustrating arrangement between an antenna wheel and a first arm wherein the antenna wheel is rotatable with respect to the first arm via a rotation positioner in accordance with an embodiment of the invention.
Figure 2D:
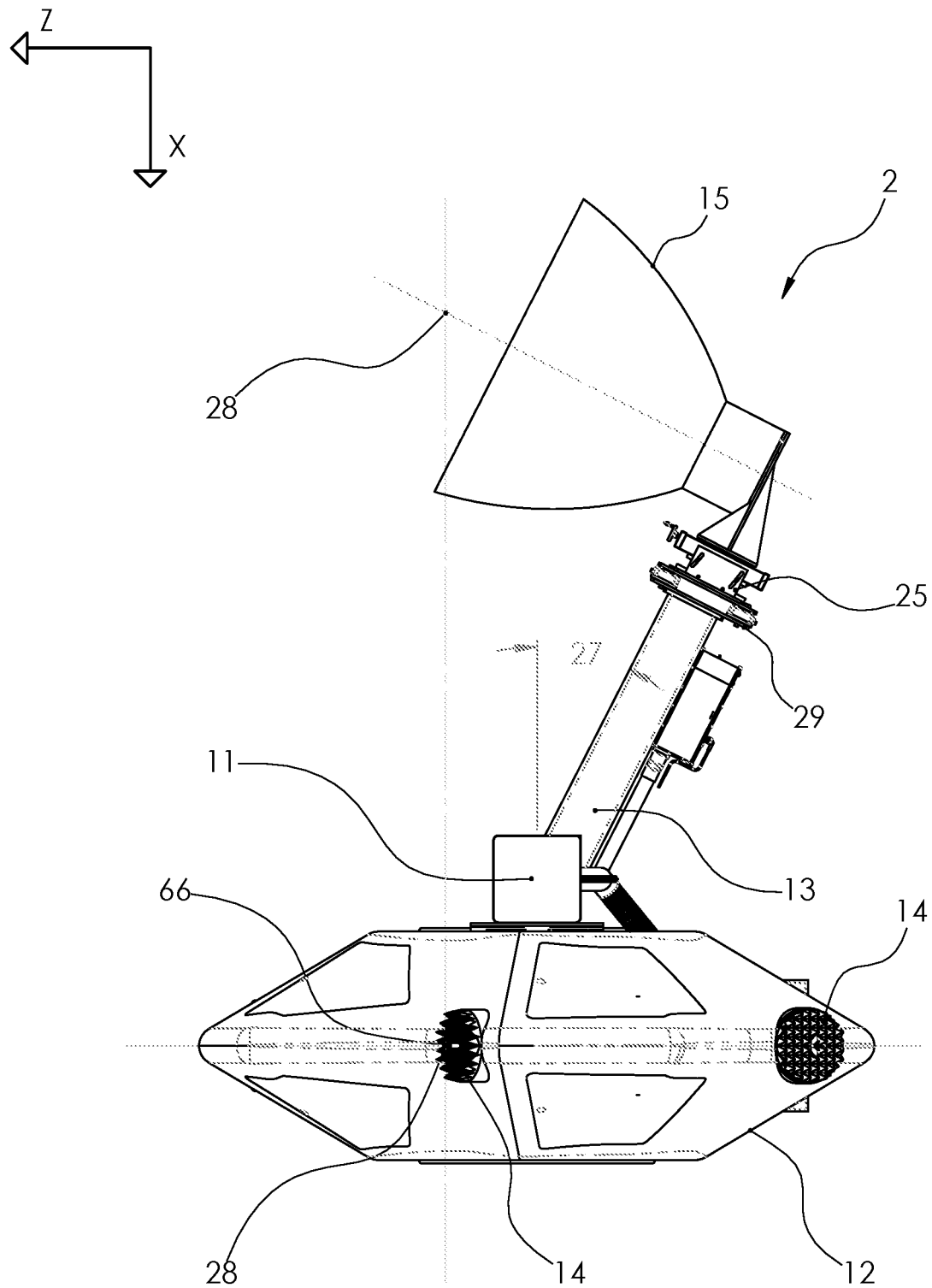
FIG. 2d is top view wherein a first arm and a second arm are disposed so that the second arm is positioned at an oblique angle in one plane with respect to a first arm, the first arm includes a rotatable antenna wheel with multiple feed sources thereon, and the second arm includes a single feed source fixed at one end thereof in accordance with an embodiment of the invention.

Referring now to FIG. 2c, the antenna wheel 12 is rotatably secured to one of the two arms 11 or 13 of the feed source changer 2 via a rotation positioner 22. A non-limiting example for the rotation positioner 22 is Series Model No. AL-1700 by MVG-Orbit. In preferred embodiments, one end of the rotation positioner 22 is mechanically fastened to a center body 24 within the antenna wheel 12 so that the rotation positioner 22 extends through an opening 65 along the antenna wheel 12. In other embodiments, the rotation positioner 22 may be secured to another component of the antenna wheel 12, one example being the shroud 32 illustrated in FIG. 3a. Another end of the rotation positioner 22 is mechanically fastened to one of the arms 11 or 13 via a mounting flange 23. The arrangement between the center body 24, the rotation positioner 22, and the mounting flange 23 secures the antenna wheel 12 to the arm 11 or 13 while permitting the antenna wheel 12 to rotate within a rotational plane 64 which is offset from the arm 11 or 13 and intersects the reflector 3. In preferred embodiments, the rotational plane 64 is oriented substantially perpendicular to the reflector 3 when the arm 11 or 13 and the antenna wheel 12 attached thereto are disposed in an upright and substantially vertical orientation, which is understood to also include a vertical orientation. Substantially perpendicular is understood to also include a perpendicular arrangement.

Referring now to FIG. 2d, the feed sources 14 within the antenna wheel 12 and the feed source 15 are attached to the respective arms 11, 13 so that one active feed source 14 or 15 within the upright or vertically disposed arm 11 or 13 is properly positioned with respect to the reflector 3 and the device under test 6 within the test range 1. The active feed source 14 or 15 is the device which communicates an emitted beam 9 onto the reflector 3. The feed sources 14 are fixed along the antenna wheel 12 so that the source point 28 of each feed source 14 is rotatable within the rotational plane 64 to permit alignment with the activation point 66. The rotational plane 64 corresponds to the y-z plane when the arm 11 is vertically oriented. The mechanically-fixed feed source 15 is rotatable within the elevational plane 63 corresponding to the x-y plane so that the source point 28 of the feed source 15 is alignable with the activation point 66. The source point 28 of the feed source 15 is aligned with the activation point 66 when the arm 13 is upright or vertically oriented. The source point 28 may correspond to the approximate, actual, or apparent point at which the electromagnetic waves originate from a feed source 14, 15. The activation point 66 is the location within the test range 1 at which the source point 28 is properly aimed with respect to the reflector 3 so that the emitted beam 9 impinges and is redirected by the reflector 3 as the reflected beam 10 toward the device under test 6. In preferred embodiments, the source point 28 of one feed source 14, 15 is positioned at the activation point 66 to communicate an emitted beam 9 from the feed source 14, 15 to the reflector 3 and a reflected beam 10 from the reflector 3 to the device under test 6.

Referring again to FIG. 2*d*, design of a feed source 14, 15, arrangement between feed source 14, 15 and arm 11, 13, or other design consideration(s) may require an angular offset between the arms 11, 13 so that the source point 28 is alignable with the activation point 66. For example, the feed source 15 at one arm 13 may require orientation at a second angle 27 within the z-x plane with respect to another arm 11. In preferred embodiments, the second angle 27 is oblique in the range from 0 degrees to less than 90 degrees with respect to the elevational plane 63.

Figure 2E:
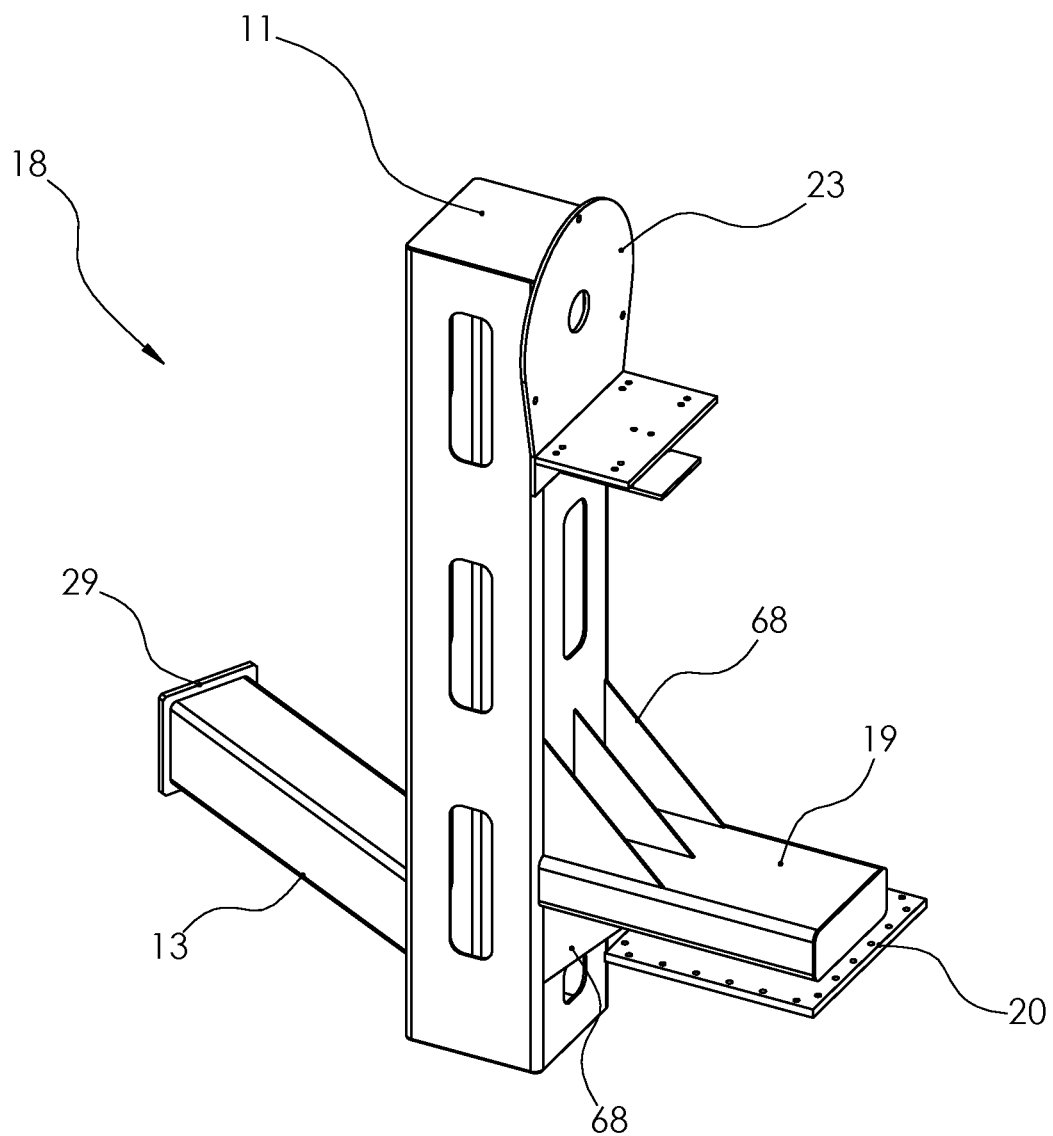
FIG. 2e is a perspective view illustrating arrangement between first and second arms wherein the arms are fixed at one end to form a support structure onto which feed sources are either directly mounted or indirectly mounted, the latter via an antenna wheel, in accordance with an embodiment of the invention.

Referring now to FIG. 2*e*, the support structure 18 may be composed of beam-like elements assembled via fastening means, examples including but not limited to fasteners, welds, or adhesives, or composed of beam-like elements formed and joined by casting or molding means. The beam-like elements could be hollow or shaped to minimize weight and/or composed of a composite or other suitable material(s). In preferred embodiments, the beam-like elements may absorb and/or controllably reflect electromagnetic radiation or may include a covering which does so.

Referring again to FIG. 2*e*, the arms 11, 13 are fixed to one another at a lower end. The beam 19 is fixed to one arm 11 at the lower end so as to extend substantially perpendicular therefrom. Substantially perpendicular is understood to also include a perpendicular arrangement. Gussets 68 or the similar reinforcement means may be required between the arm 11 and the beam 19, as well as between other components, to prevent deflections which might otherwise frustrate proper alignment of the source points 28 to the activation point 66. The mounting flange 20 is fixed to the beam 19. The mounting flange 20 is configured to permit attachment of the elevation positioner 17 to the support structure 18. The mounting flange 23 is fixed to the arm 11 at the upper end and above the beam 19. The mounting flange 23 is configured to permit attachment of the rotation positioner 22 to the support structure 18. The mounting flange 29 is fixed to the arm 13 at the upper end. The mounting flange 29 is configured to permit attachment of a feed source 15 to the support structure 18.

Figure 2F:
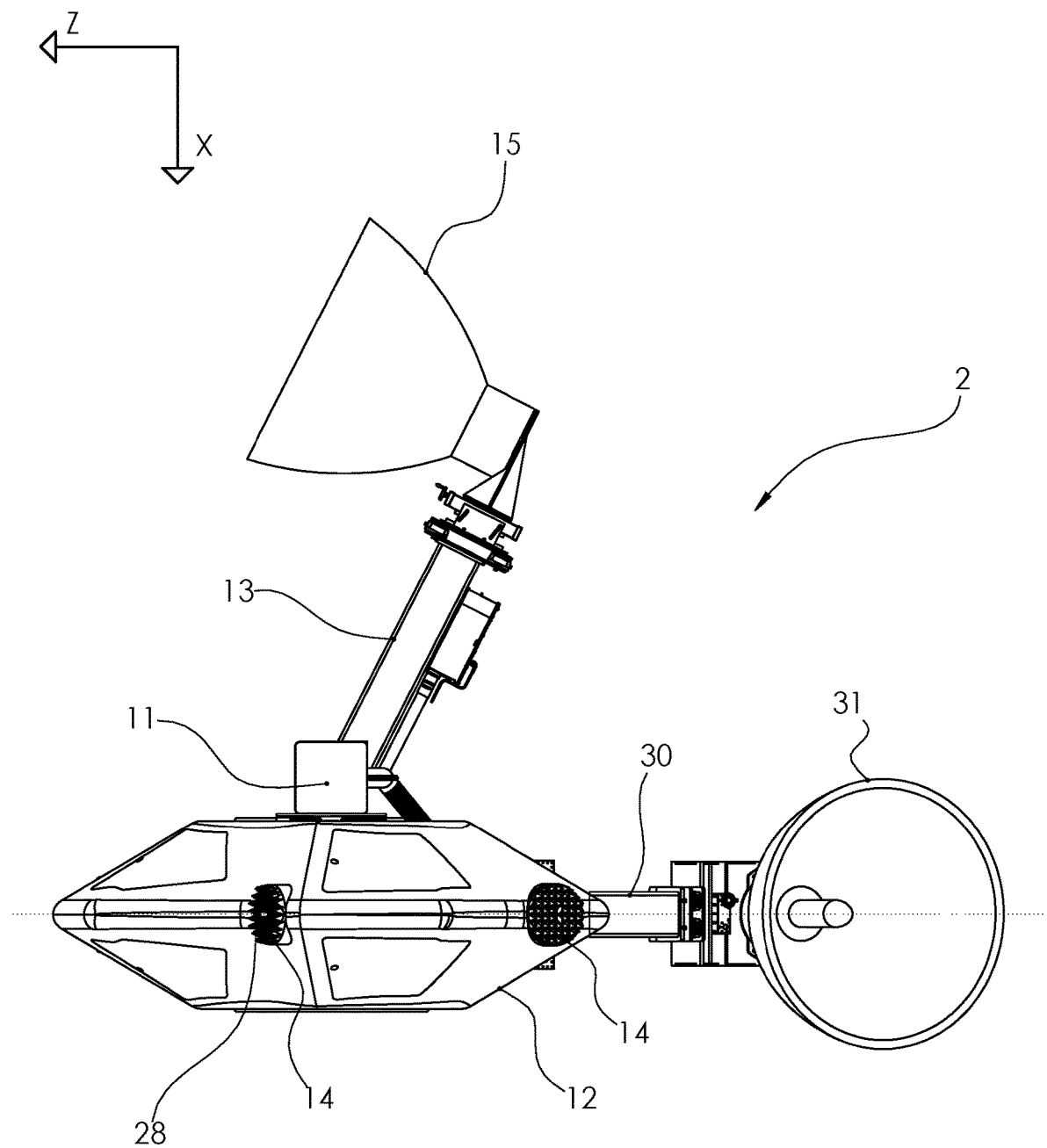
FIG. 2f is a top view illustrating an optional embodiment of a feed source changer wherein multiple arms are disposed in a fixed arrangement so as to be rotatable about a base wherein the first arm includes a rotatable antenna wheel with multiple feed sources thereon and both second and third arms include a single feed source fixed at one end thereof in accordance with an embodiment of the invention.

Referring now to FIG. 2*f*, it may be advantageous in other embodiments for the feed source changer 2 to include more than two arms 11, 13. For example, a third arm 30 with a feed source 31 or an antenna wheel 12 (not shown) attached thereto may be fixed to the pair of arms 11, 13. The third arm 30 could be disposed with the second arm 13 within the z-x plane and further disposed with the first arm 11 within the y-z plane. The support structure 18 described in FIG. 2*e* would require three rather than just two arms. A single elevation positioner 17 or a paired arrangement of elevation positioners 17 could rotate the arms 11, 13, 30 with respect to the base 16 within both x-y and y-z planes so that the source point 28 of each feed source 14, 15, 31 is alignable with the activation point 66.

Figure 2G:
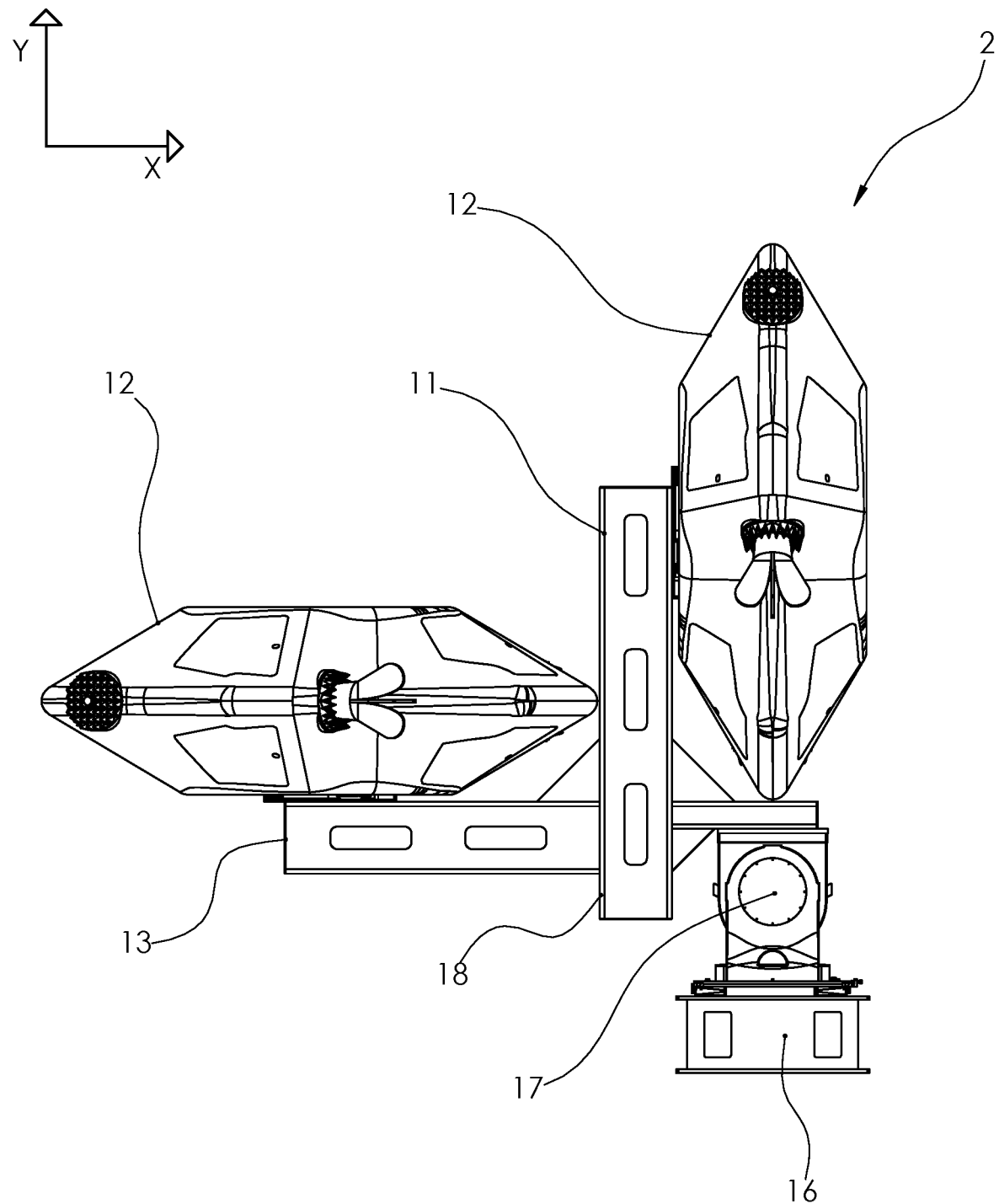
FIG. 2g is a front side view illustrating a feed source changer wherein a first arm and a second arm are disposed in a fixed arrangement so that both arms are rotatable about a base, the first arm includes a rotatable antenna wheel with multiple feed sources thereon, and the second arm includes a rotatable antenna wheel with multiple feed sources thereon in accordance with an embodiment of the invention.

Referring now to FIG. 2*g*, it may be advantageous in yet other embodiments for the feed source changer 2 to include more than one antenna wheel 12. For example, an antenna wheel 12 could be rotatably attached to one arm 11 and a second antenna wheel 12 could be rotatably attached to another arm 13. Rotation of the support structure 18 about the base 16 by the elevation positioner 17 would vertically position an antenna wheel 12 within the test range 1 when one arm 11 or 13 is substantially vertical and another arm 13 or 11 is substantially horizontal. Substantially vertical is understood to also include a vertical arrangement. Substantially horizontal is understood to also include a horizontal arrangement. It is possible in some embodiments for two or all arms 11, 13, 30 of the feed source changer 2 in FIG. 2*f* to include an antenna wheel 12.

Figure 3A:
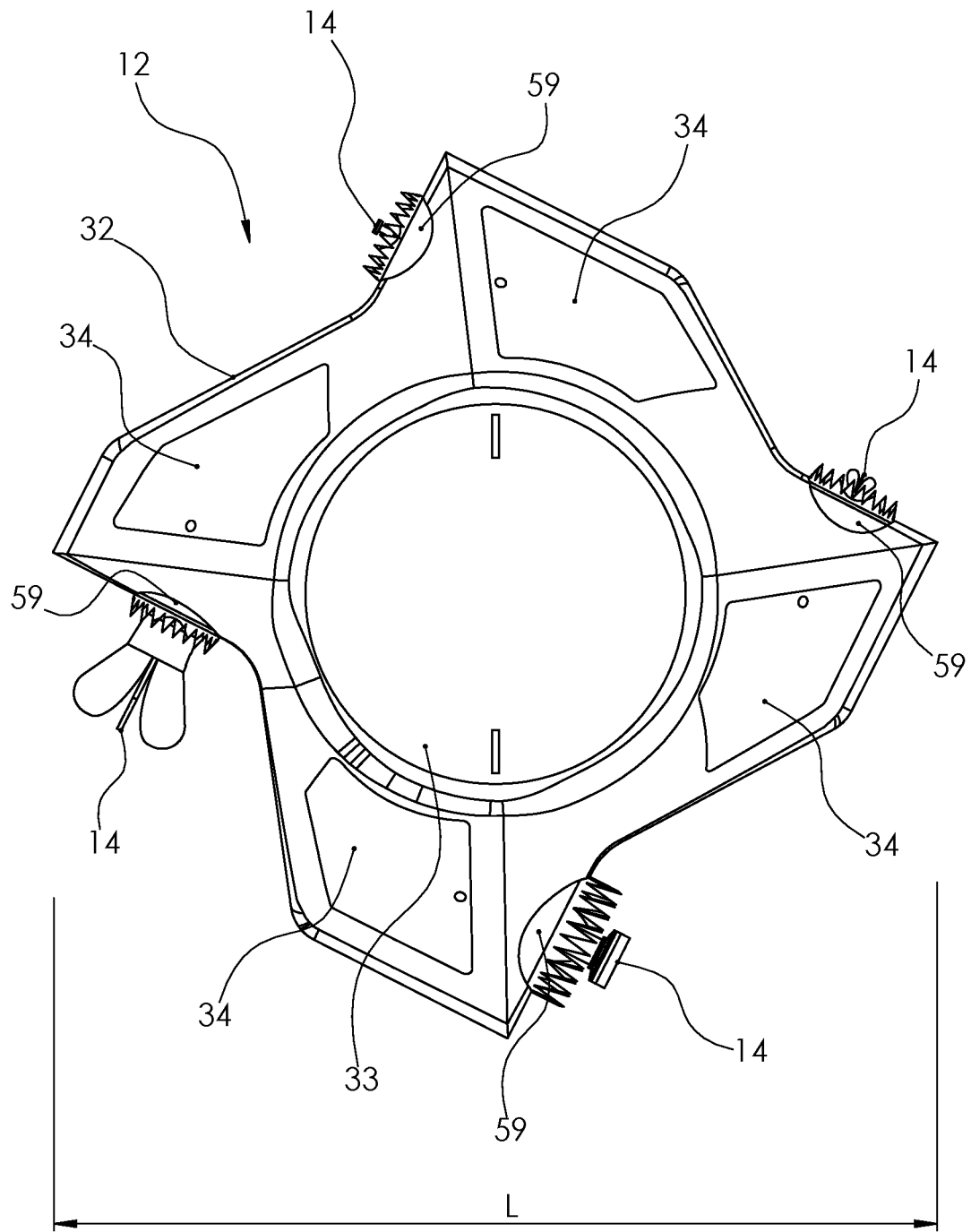
FIG. 3a is a side view illustrating exterior features of an antenna wheel in accordance with an embodiment of the invention.
Figure 3B:
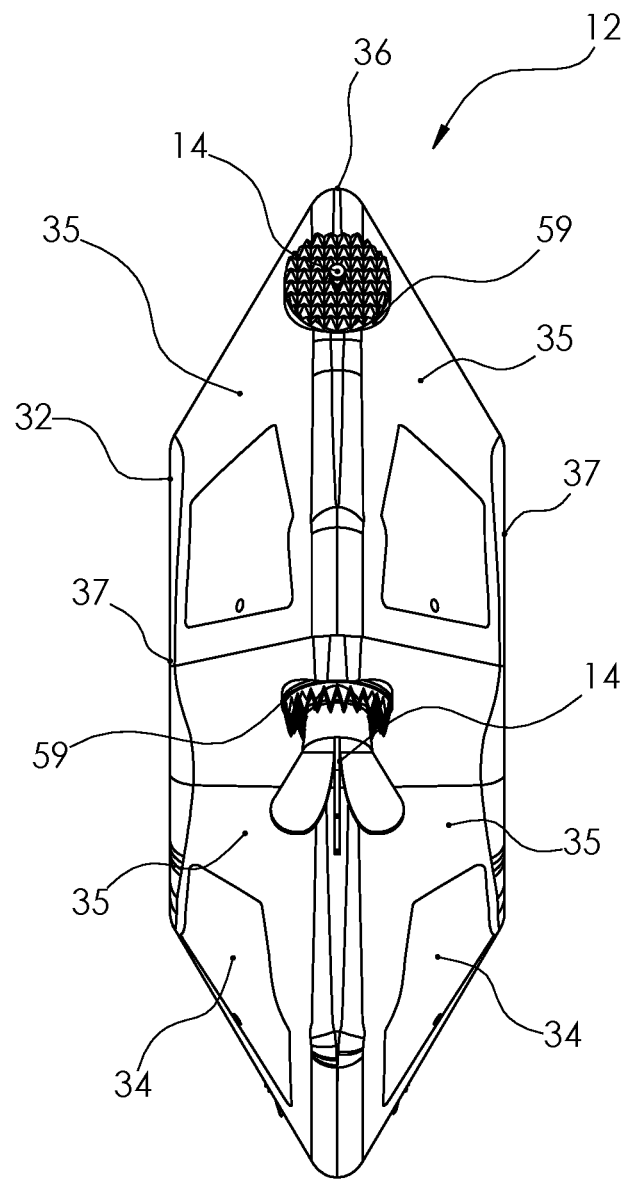
FIG. 3b is a front view illustrating exterior features of an antenna wheel in accordance with an embodiment of the invention.
Figure 3C:
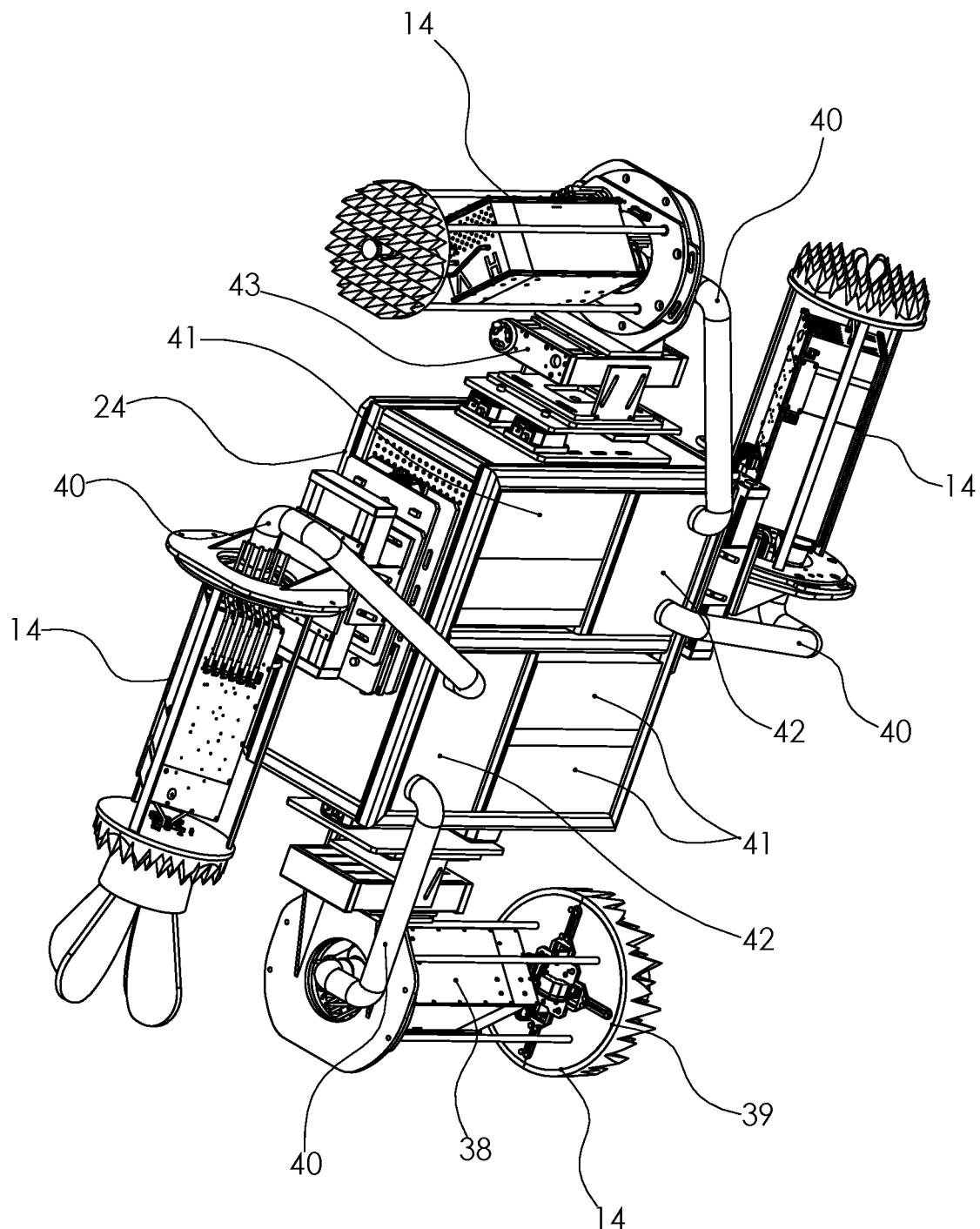
FIG. 3c is a perspective view illustrating interior features of an antenna wheel (shroud not shown) in accordance with an embodiment of the invention.
Figure 3D:
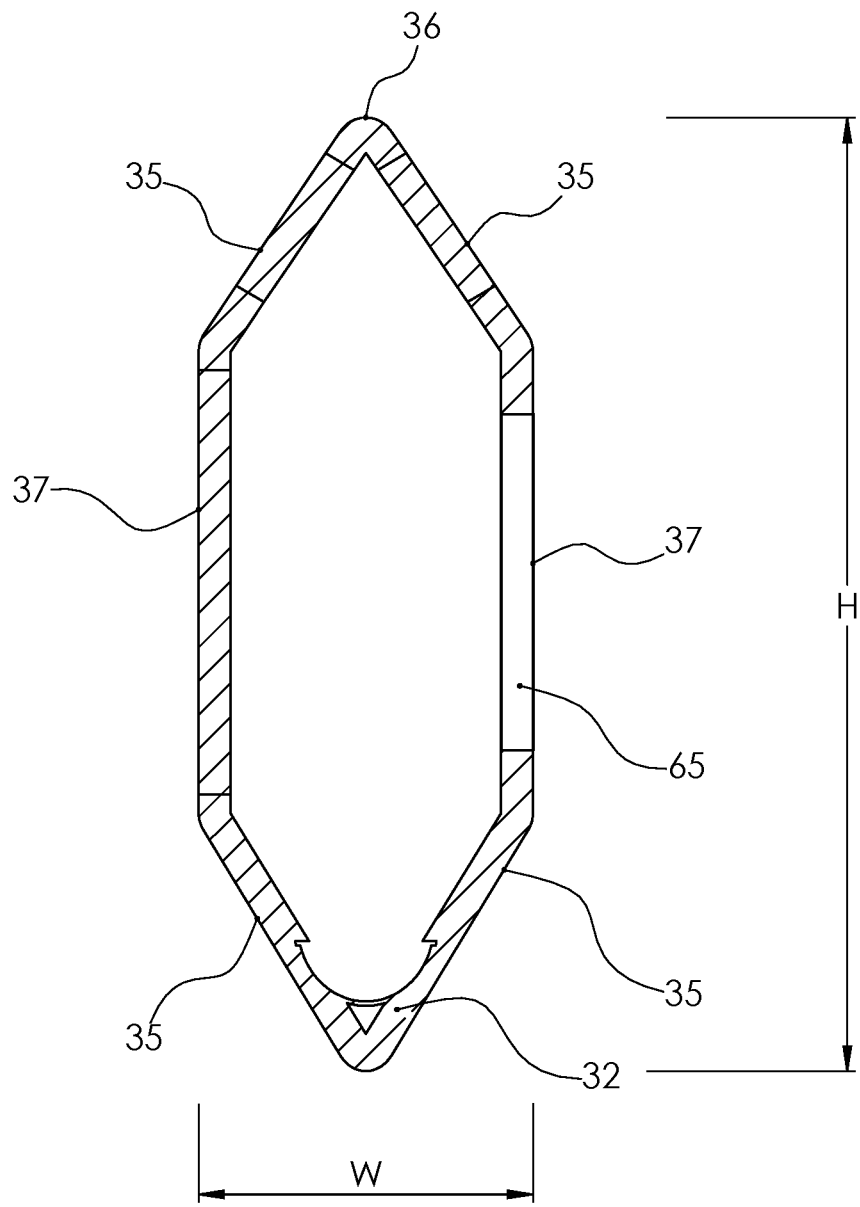
FIG. 3d is a cross-section view illustrating features of a shroud (center body not shown) in accordance with an embodiment of the invention.

Referring now to FIGS. 3*a*, 3*b*, and 3*d*, the antenna wheel 12 includes a shroud 32 which defines the generally circular-shaped side profile illustrated in FIG. 3*a* and the generally hexagonal-shaped front profile illustrated in FIGS. 3*b* and 3*d*, although other profiles are possible in both views. The shroud 32 may be composed of one or more materials which absorb, dissipate, and/or reflect electromagnetic energy. The shroud 32 is bounded by a side panel 33 at one side 37 and an opening 65 at another side 37. Two or more openings 59 are positioned along the shroud 32 between the sides 37. In preferred embodiments, an opening 59 is disposed adjacent to the front end of each feed source 14 so as to allow a feed source 14 to direct an electromagnetic wave in an outward direction from the antenna wheel 12 without attenuation by the shroud 32. In some embodiments, the shroud 32 may include an access panel 34 adjacent to one or more feed sources 14 which permits repair, maintenance, replacement, and/or inspection of components surrounded by the shroud 32. The access panel 34 may be removably secured to the shroud 32 or other component(s) of the antenna wheel 12 via mechanical fasteners or other suitable means.

Referring again to FIGS. 3*a*, 3*b*, and 3*d*, the shroud 32 includes a ridge 36 disposed between and radially larger than the sides 37. The ridge 36 is defined by the paired arrangement of facets 35 about the shroud 32. Each facet 35 may include planar and/or curved features. The outer edges of the paired facets 35 intersect to define ridge 36. In preferred embodiments, the facets 35 intersect at an oblique angle whereby the cross section of the ridge 36 may form an apex which is either curved or pointed. The inner edges of the facets 35 along one side 37 intersect the side panel 33. In some embodiments, the side panel 33 may be removably secured to the inner edges of the facets 35. The inner edges of the facets 35 along another side 37 cooperate to define the opening 65 through which the rotation positioner 22 extends to couple the center body 24 to an arm 11, 13, such as illustrated in FIG. 2*c*.

Referring again to FIGS. 3*a*, 3*b*, and 3*d*, the facets 35 define a height (H) to width (W) profile, a length (L) to width (W) profile, and a ridge 36 profile that cooperate to redirect electromagnetic waves laterally outward and away from the sides 37 of the antenna wheel 12. In preferred embodiments, the ratio of height (H) to width (W) is greater than 1, the ratio of length (L) to width (W) is greater than 1, and the ratio of height (H) to length (L) is equal to 1. Reflective, dissipative, and/or absorption aspects of the shroud 32 at least minimize or avoid rogue reflections which might otherwise enter the quiet zone 7 or impinge the device under test 6.

Referring now to FIG. 3*c*, a center body 24 is disposed within the shroud 32 (not shown). The center body 24 may include a rack-like or frame-like construction with the structural characteristics required for attachment of the antenna wheel 12 to an arm 11, 13 and for mounting components critical to function of the antenna wheel 12. In some embodiments, a feed source 14 may be directly attached to an outer or circumferential side of the center body 24. In other embodiments, a feed source 14 may be indirectly attached to the center body 24 via an antenna positioner 43, the latter facilitating positional adjustments to the feed source 14 for alignment of the source point 28 to the activation point 66. In preferred embodiments, the feed sources 14 are aligned along the rotational plane 64 of the center body 24, the latter illustrated in FIG. 2*c*. This arrangement circumferentially mounts the feed sources 14 tangentially within the plane of the center body 24 such as illustrated in FIG. 3*c*.

Referring again to FIG. 3*c*, one or more electronics modules 41 or other components required for operation of a feed source 14 may be attached to and/or housed within the center body 24. One or more plenums 42 may be attached to, formed within, or housed within another location(s) of the center body 24. A duct 40 may communicate at one end with a feed source 14 and at another end to a plenum 42 so as to facilitate a flow path from the feed source 14 to the plenum 42. Ducts 40 and plenums 42 are particularly advantageous for cooling feed sources 14, electronics modules 41, and other sources of heat within the antenna wheel 12.

Figure 4A:
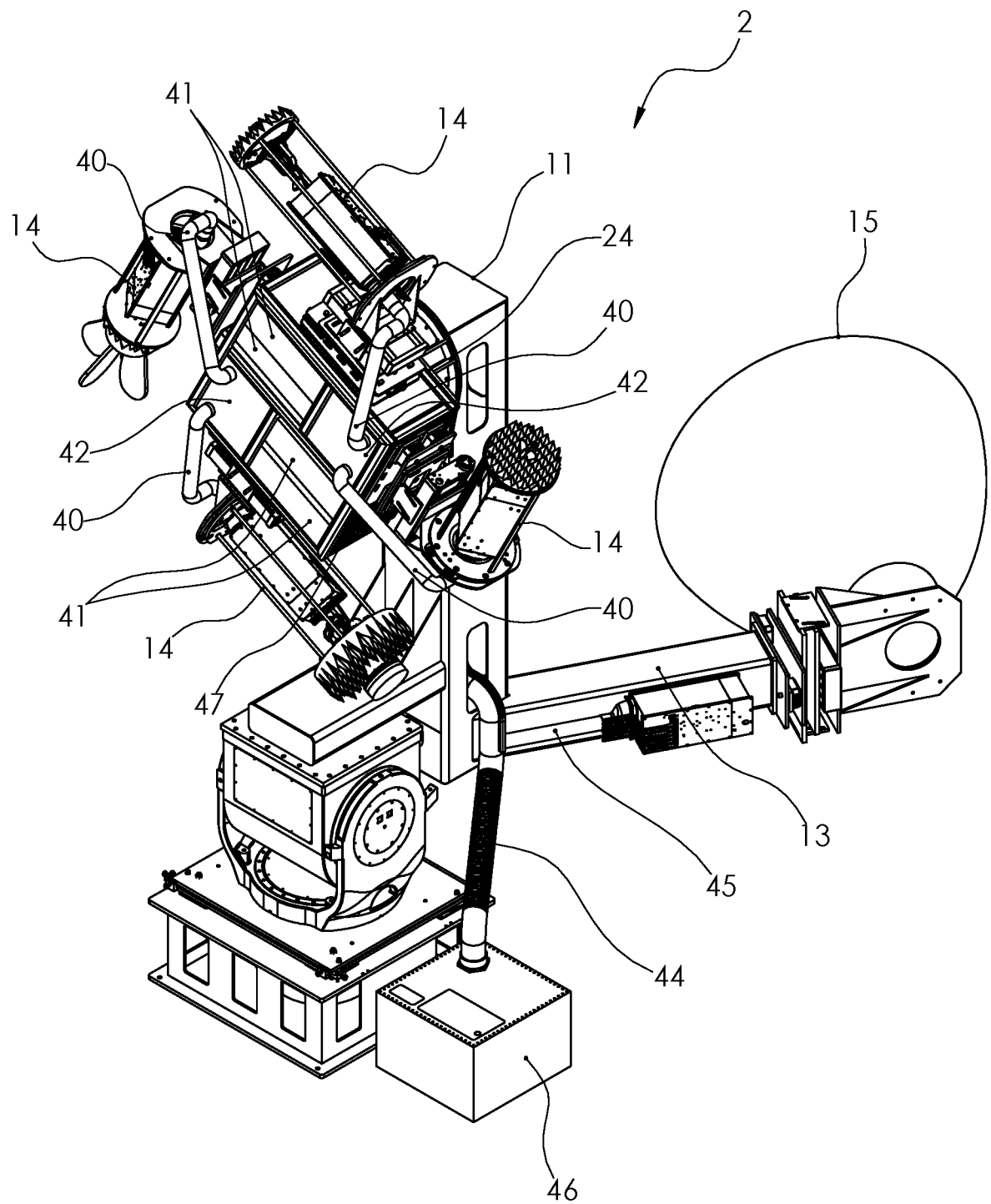
FIG. 4a is a perspective view illustrating components which facilitate cooling of feed sources and electronics within an antenna wheel (shroud not shown) and venting of heat therefrom in accordance with an embodiment of the invention.
Figure 4B:
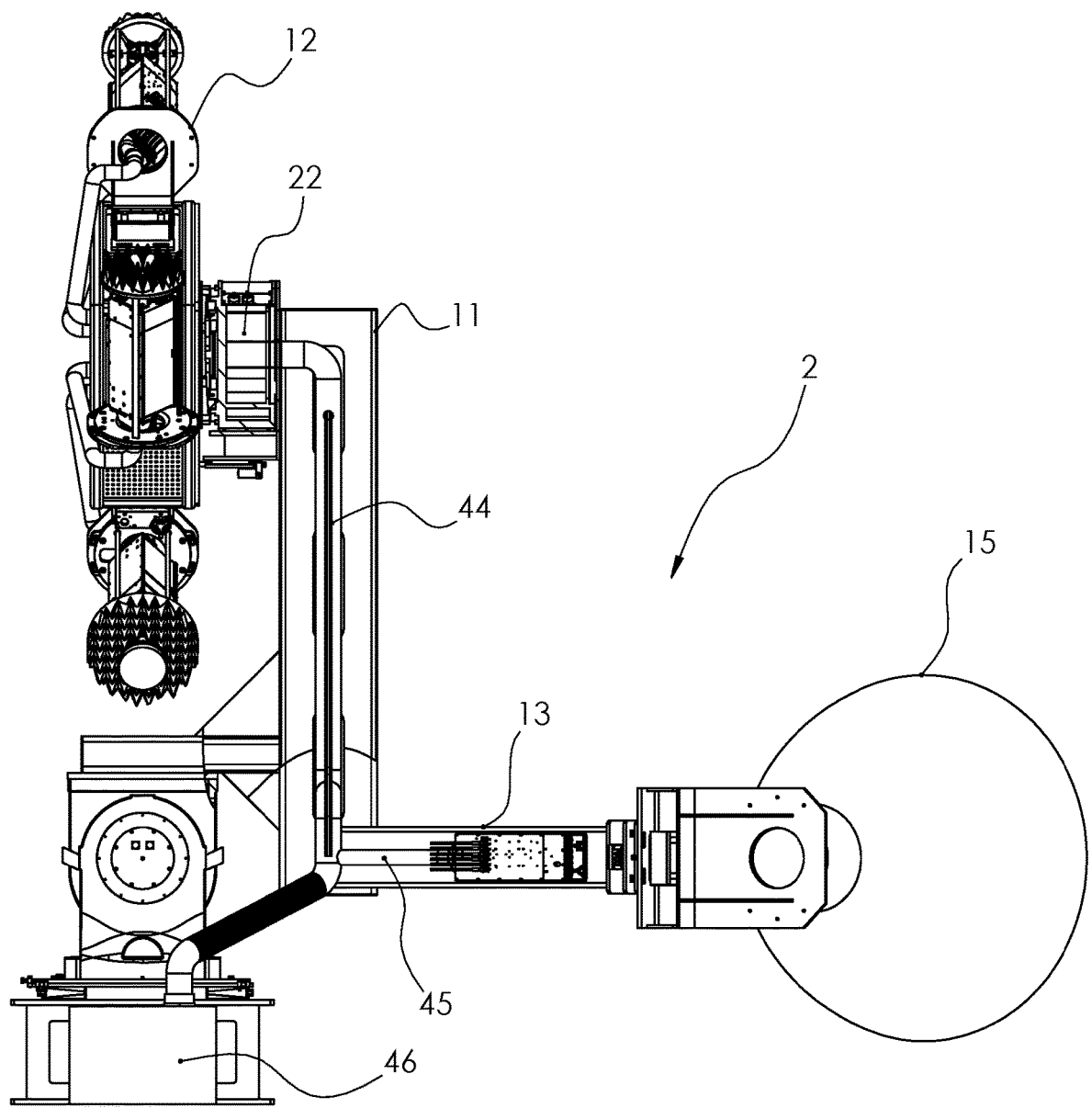
FIG. 4b is a rear side view with partial cross section illustrating components which facilitate cooling of feed sources and electronics within an antenna wheel (shroud not shown) and venting of heat therefrom in accordance with an embodiment of the invention.

Referring now to FIGS. 4*a* and 4*b* with further reference to FIG. 1, the center body 24 is rotatably mounted to an arm 11 of the feed source changer 2 via the rotation positioner 22 so that the antenna wheel 12 (shown without shroud 32) is rotatable. The antenna wheel 12 may rotate either clockwise or counterclockwise. The antenna wheel 12 is rotated so that the source point 28 of one feed source 14 is located at the activation point 66 such as illustrated in FIG. 2*d*. The overlay between the source point 28 and the activation point 66 ensures that the corresponding feed source 14 is properly positioned and aimed with respect to the reflector 3 and the device under test 6, the latter two components shown in FIG. 1. The feed source 14 positioned at the activation point 66 is then activated to emit electromagnetic radiation in the general direction of the reflector 3. The alignment of the feed source 14 at the activation point 66 ensures the emitted beam 9 is properly directed with respect to the reflector 3 so that the reflected beam 10 is properly directed toward the device under test 6 such as illustrated in FIG. 1. When the arm 11 or 13 has a feed source 15 fixed thereto, the arm 11 or 13 is rotated into position so that the source point 28 overlays the activation point 66 allowing the emitted electromagnetic radiation to be properly directed toward the reflector 3 for redirection onto the device under test 6.

Referring again to FIGS. 4*a* and 4*b*, components within the feed source changer 2 in some embodiments may require cooling. A first end of the duct 40 is positioned in contact with or adjacent to the feed source 14 so that an airflow passes over or through, thereby across, the feed source 14 and then enters the duct 40. A second end of the duct 40 is fixed to and communicates with a plenum 42 so that the airflow heated by the feed source 14 passes through the duct 40 and then enters the plenum 42. Other airflow(s) may enter the center body 24 via a perforated plate 47 or the like so that the airflow passes over or through one or more other heat generating components, such as the electronics module(s) 41, before entering the plenum 42. The plenum 42 and/or the center body 24 may include an opening or the like with permits airflow to pass from the electronic module(s) 41 into the plenum 42.

Referring again to FIGS. 4*a* and 4*b*, a duct 44 communicates at one end with the plenum(s) 42 and at another end with a cooling unit 46 so as to facilitate a pathway for airflow from the plenum(s) 42 to the cooling unit 46. The duct 44 passes through a hole along the rotation positioner 22 so that the open end of the duct 44 is aligned with the center body 24. In preferred embodiments, the interface between the duct 44 and the center body 24 should permit the center body 24 to rotate with respect to the duct 44 and also allow airflow from the plenum(s) 42 to enter the duct 44. In some embodiments, the duct 44 may traverse a cavity through the arm 11 and then exit the arm 11 adjacent to the cooling unit 46. In other embodiments, the duct 44 may be secured to a side of the arm 11. At least a portion of the duct 44 may be bendable or flexible to accommodate movement by the arms 11, 13.

Referring again to FIGS. 4*a* and 4*b*, a duct 45 may be positioned at one end in contact with or adjacent to the feed source 15 attached to the other arm 13 and at another end to intersect the duct 44. This arrangement allows airflow to enter the duct 45 at the feed source 15 which then passes through the duct 45 before entering the second duct 44. The combined airflow from the ducts 44, 45 passes into the cooling unit 46. In some embodiments, the cooling unit 46 may vent the airflow into the test range 1 at a location which does not degrade measurements therein. In other embodiments, the cooling unit 46 may vent the airflow to a location external to the test range 1.

Referring again to FIGS. 3*a*, 3*d*, 4*a*, and 4*b*, the airflow may enter the antenna wheel 12 via one or more openings 59, 65 along the shroud 32. The airflow may pass in part or whole over or through one or more feed sources 14, 15 and/or one or more electronics modules 41. A portion of the airflow passes over or through and cools each feed source 14 before entering the first ducts 40 which direct the now heated airflow into the plenums 42. The second duct 44 receives the heated airflow from the plenums 42 and directs the heated airflow out of the antenna wheel 12. The cooling unit 46 is adapted to receive the heated airflow from the second duct 44. A portion of the airflow within the antenna wheel 12 may enter the center body 24 and then pass over or through one or more electronics modules 41 so as to remove heat therefrom. The center body 24 may include one or more perforated plates 47 which permit airflow to enter a location(s) which facilitates flow across the electronics modules 41. The air heated by the electronics module 41 enters the plenum 42 and is directed into the duct 44 before passing into the cooling unit 46. The duct 45 may facilitate cooling of the feed source 15 attached to the arm 13 by receiving air within the test range 1 which passes over or through and is heated by the feed source 15. The duct 45 may be coupled to the duct 44 so that heated air from the antenna wheel 12 and the fixed feed source 15 are jointly directed into the cooling unit 46 before venting into or out of the test range 1. In other embodiments, the duct 45 may directly communicate airflow into the cooling unit 46. In yet other embodiments, the cooling unit 46 may alter the temperature of the airflow before venting.

Figure 4C:
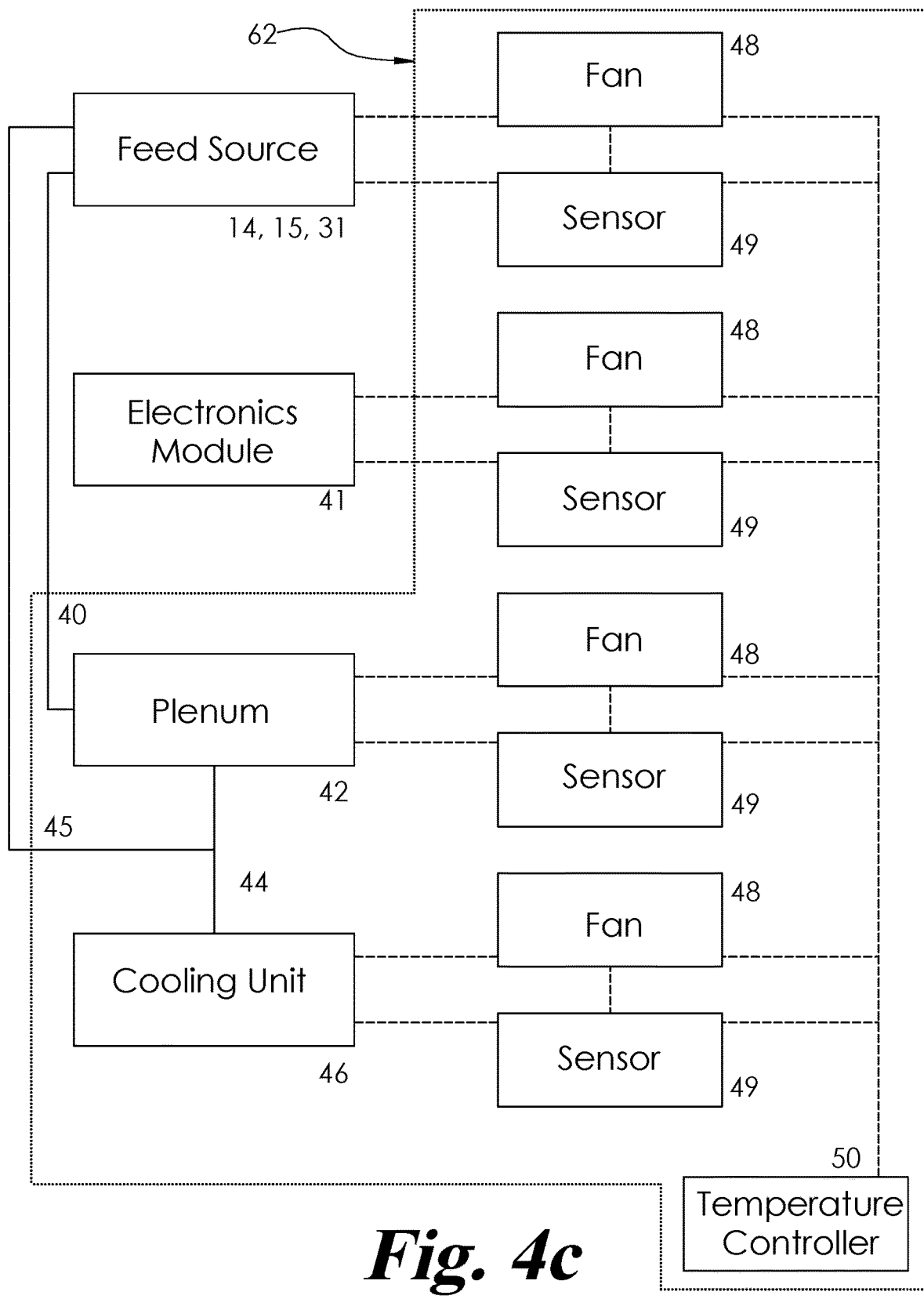
FIG. 4c is a block diagram illustrating components of a cooling system in accordance with an embodiment of the invention.

Referring now to FIG. 4*c*, fan(s) 48 and optional sensor(s) 49 may be employed to implement a cooling system 62 which removes heat generated within the feed source changer 2 at the antenna wheel 12 and/or the feed source 15, 31. The fan(s) 48 is/are configured to move air across the feed source(s) 14, 15, 31 and the electronics module(s) 41 and through the ducts 40, 44, 45 and the plenum(s) 42. The fan(s) 48 may be disposed within or adjacent to the feed source(s) 14, 15, 31, the electronics module(s) 41, the plenum(s) 42, the cooling unit(s) 46, and/or one or more ducts 40, 44, 45. In preferred embodiments, a fan 48 within the cooling unit 46 only may be sufficient to achieve the airflow required within a feed source changer 2. Sensor(s) 49 may be disposed within or adjacent to fan(s) 48, feed source(s) 14, 15, 31, plenum(s) 42, electronics module(s) 41, cooling unit 46, and/or duct(s) 40, 44, 45 so as to measure the temperature of the airflow or other parameter indicative of heating and/or cooling, a non-limiting example of the latter being flow rate. In some embodiments, sensor(s) 49 may communicate directly with the fan(s) 48 to implement adjustments, a non-limiting example being increasing or decreasing the speed of the fan(s) 48. In other embodiments, sensor(s) 49 may communicate with a temperature controller 50 which adjusts operation of the fan(s) 48.

Figure 5A:
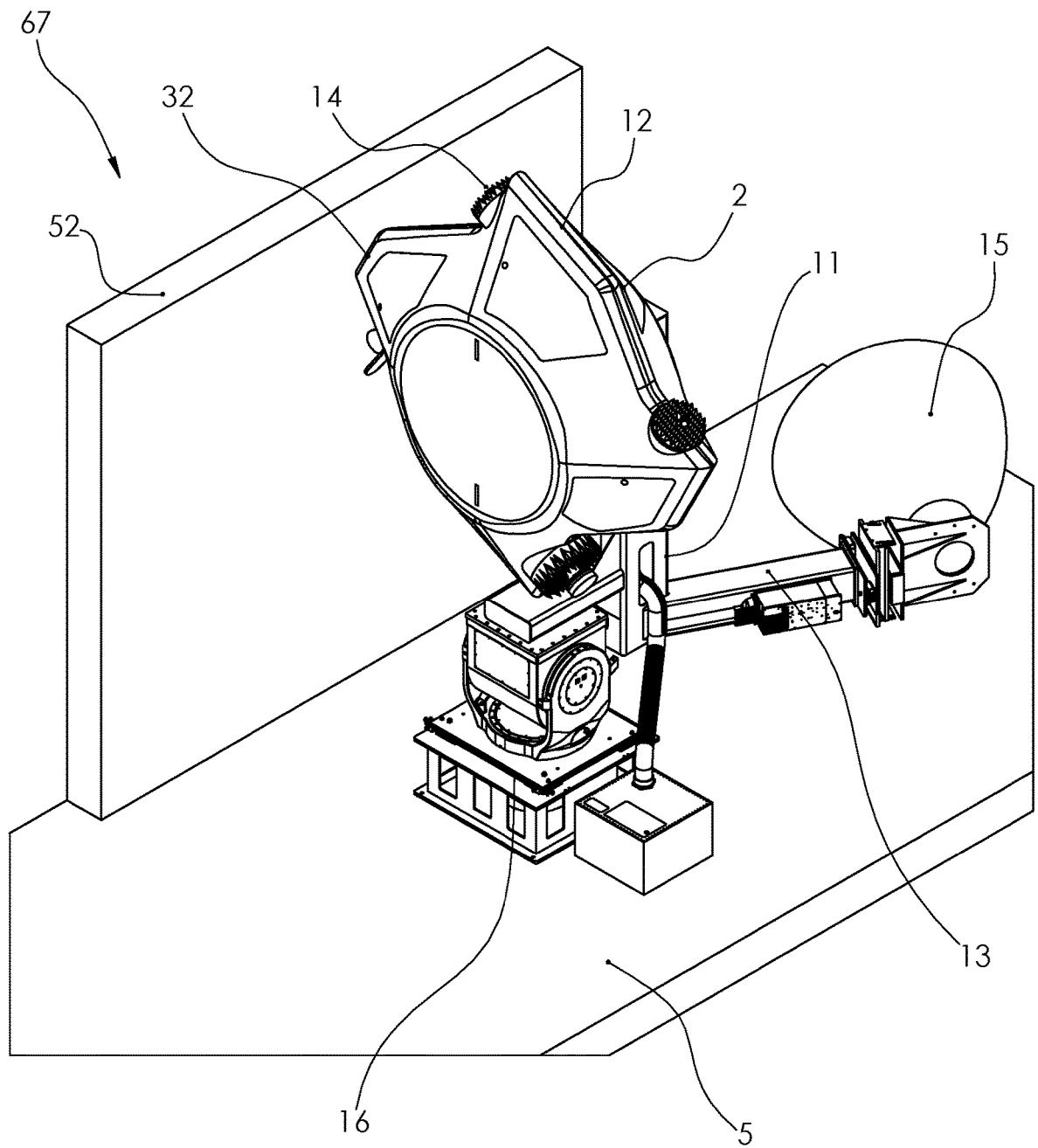
FIG. 5a is a perspective view illustrating a feed source changer mounted at floor level with a concealment panel arranged to minimize reflections from a horizontally stowed arm, a lower portion of a vertically disposed arm, and components at the base of the arms in accordance with an embodiment of the invention.

Referring now to FIG. 5a, the feed source changer 2 may be mounted to the floor 5 of a test range 1. In these embodiments, the base 16 is secured to the floor 5 so that the feed source changer 2 extends therefrom. One or more concealment panels 52 may be secured to the floor 5 adjacent to the feed source changer 2 in the direction of the reflector 3. A concealment panel 52 may be oriented, shaped, and/or composed of material(s) which minimize reflections of electromagnetic waves within the test range 1. In one non-limiting example, a concealment panel 52 may include absorbers 8. The concealment panel 52 extends upward from the floor 5 so as to shield the horizontally disposed arm 11 or 13 with components mounted thereto and some or all of the vertically disposed arm 13 or 11 with components mounted thereto. Regardless, it is understood that the concealment panel 52 should not impede or otherwise reduce or degrade the electromagnetic beam directed toward the reflector 3 by an active feed source 14, 15, 31 along a vertically disposed arm 11, 13, 30.

Referring again to FIG. 5a, the concealment panel 52 and the feed source changer 2 may be positioned and/or sized to cooperate to achieve a concealment system 67 whereby the horizontal arm 13 with fixed feed source 15 is shielded to minimize rogue reflections, whereby the vertical arm 11 in part or whole and none, some or all of the antenna wheel 12 with shroud 32 are shielded to minimize rogue reflections, and whereby the feed source 14 is positioned and oriented to emit a beam over the concealment panel 52 which impinges the reflector 3. When the arm 13 is vertically deployed, the concealment panel 52 would shield the horizontal arm 11 with antenna wheel 12 to minimize rogue reflections, the vertical arm 13 in part or whole and none, some or all of the feed source 15 would be shielded to minimize rogue reflections, and the feed source 15 is positioned and oriented to emit a beam over the concealment panel 52 which then impinges the reflector 3.

Figure 5B:
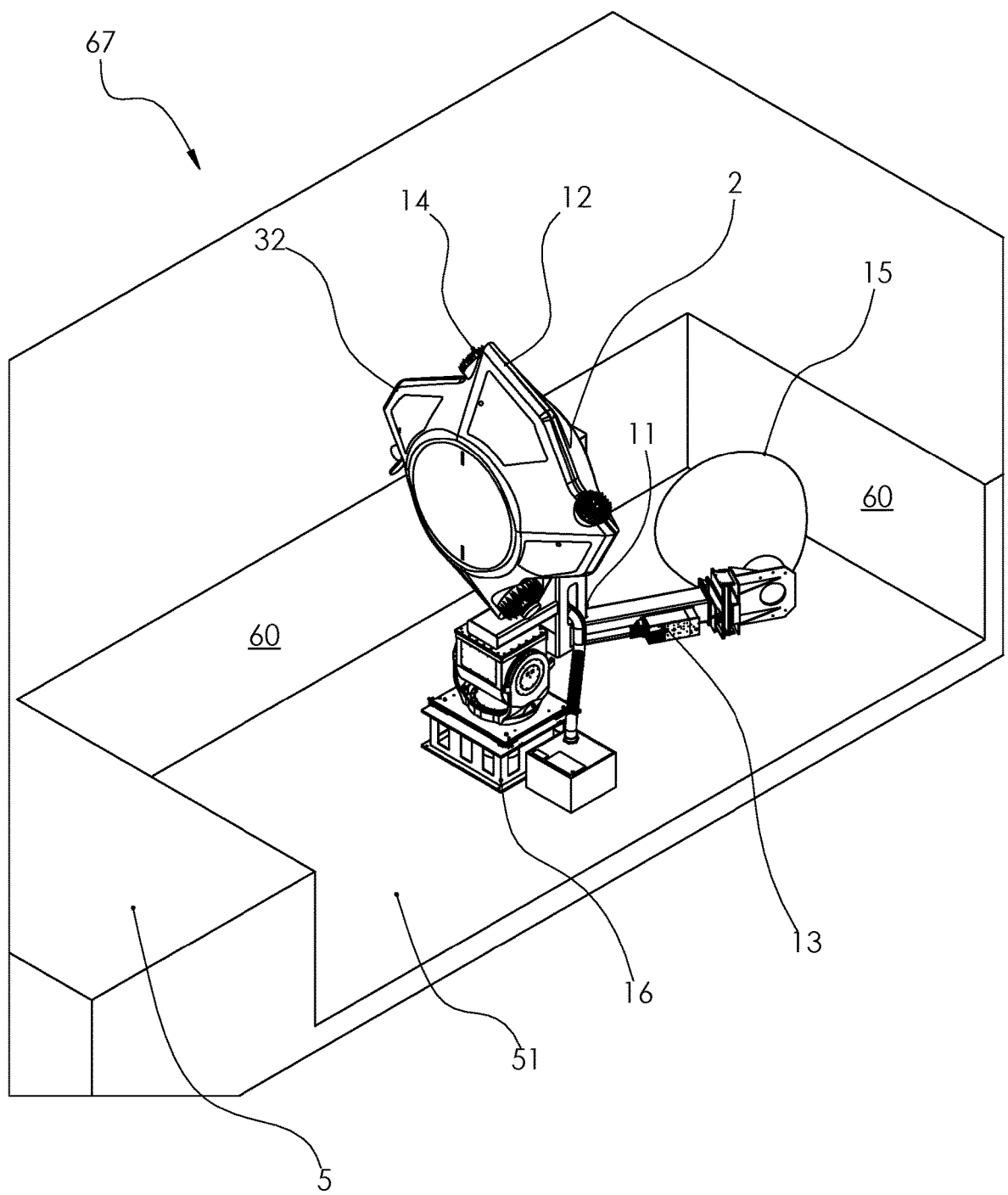
FIG. 5b is a perspective view illustrating a feed source changer mounted within a pit so as to minimize reflections from a horizontally stowed arm, a lower portion of a vertically disposed arm, and mounting components at the base of the arms in accordance with an embodiment of the invention.

Referring now to FIG. 5b, the feed source changer 2 may be mounted within a pit 51. In these embodiments, the base 16 is secured within the pit 51 below the floor 5 of the test range 1 so that the feed source changer 2 is surrounded by the wall(s) 60 which define the pit 51. The feed source changer 2 may include at least one arm 11, 13, or 30 which is rotatable between substantially horizontal and substantially vertical positions for purposes of embodiments of the concealment system 67, as well as for other embodiments described herein for the test range 1, the feed source changer 2, the antenna wheel 12, and the cooling system 62. In some embodiment, one or more walls 60 function as concealment panel(s) 52 so that the recessed orientation of the feed source changer 2 within the pit 51 minimizes reflections of electromagnetic waves off of the feed source changer 2 into the test range 1. In other embodiments, one or more walls 60 within the pit 51 could include absorbers 8. In yet other embodiments, concealment panel(s) 52 may extend up from the floor 5, such as generally illustrated in FIG. 5a, about the pit 51. The feed source changer 2 is disposed within the pit 51 so that the horizontally disposed arm 11 or 13 with components mounted thereto and some or all of the vertically disposed arm 13 or 11 with components mounted thereto are shielded. Regardless, it is understood that the recessed orientation of the feed source changer 2 within the pit 51 should not impede or otherwise reduce or degrade the electromagnetic beam directed toward the reflector 3 by an active feed source 14, 15 along a vertically disposed arm 11, 13.

Referring again to FIG. 5b, the pit 51 and the feed source changer 2 are positioned and/or sized to cooperate to achieve a concealment system 67 whereby the horizontal arm 13 with fixed feed source 15 is shielded to minimize rogue reflections, whereby the vertical arm 11 in part or whole and none, some or all of the antenna wheel 12 with shroud 32 are shielded to minimize rogue reflections, and whereby a feed source 14 is positioned and oriented to emit a beam over the wall 60 and/or the concealment panel(s) 52 which impinges the reflector 3. It is understood that when the arm 13 is vertically deployed, the wall(s) 60 and/or the concealment panel(s) 52 would shield the horizontal arm 11 with antenna wheel 12 to minimize rogue reflections, the vertical arm 13 in part or whole and none, some or all of the feed source 15 would be shielded by the walls 60 and/or the concealment panel(s) 52 to minimize rogue reflections, and the feed source 15 is positioned and oriented to emit a beam over the wall(s) 60 and/or concealment panel(s) 52 which then impinges the reflector 3.

Figure 6A:
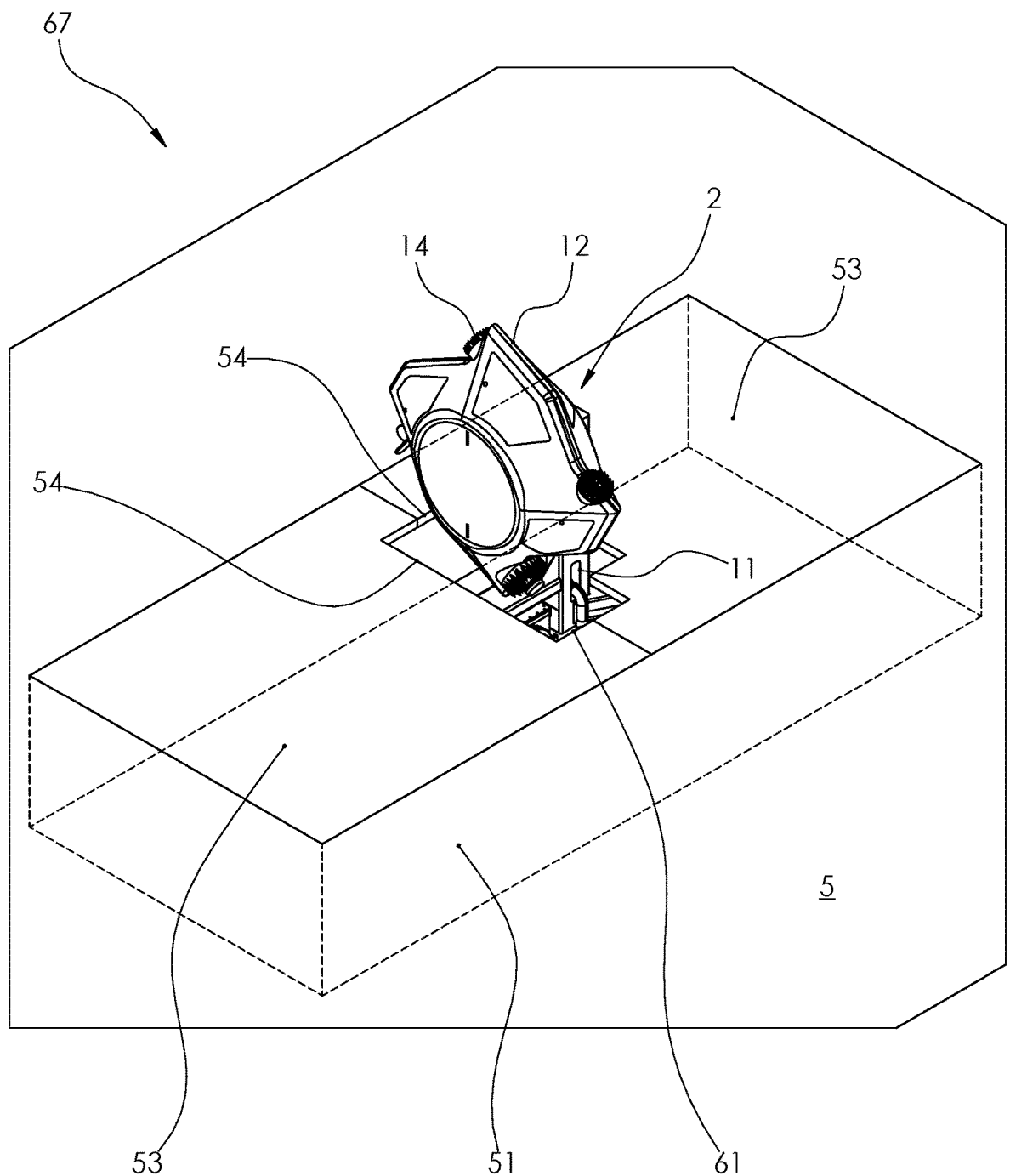
FIG. 6a is a perspective view illustrating arrangement between a feed source changer disposed within a pit and concealment panels therefore wherein the concealment panels are in a CLOSED position so as to minimize reflections from components of the feed source changer within the pit and also to allow proper function of a feed source along an arm vertically extending through the concealment panels in accordance with an embodiment of the invention.

Referring now to FIG. 6a, it may be advantageous in some embodiments for one or more concealment panels 53 to cover the pit 51 about the vertically disposed portion of the feed source changer 2. For example, a pair of concealment panels 53 may each include a notch 54 which define an opening 61 about the vertically disposed arm 11 or 13. It is likewise possible for a single notch 54 to define the opening 61. An antenna wheel 12 with feed sources 14 or a fixed feed source 15 (not shown) may extend above the opening 61 in part or whole. In some embodiments, the antenna wheel 12 with feed sources 14 or the fixed feed source 15 attached to the vertically oriented arm 11 or 13 may be disposed within the pit 51 below the opening 61 and the concealment panel(s) 53 may or may not be movable. Regardless, it understood that the concealment panel(s) 53 should not impede the beam emitted by an active feed source 14, 15 which might require the emitted beam to pass through the opening 61 in some embodiments, the latter may permit the arms 11, 13 to rotate when the concealment panel(s) 53 are CLOSED. A concealment panel 53 may be oriented, shaped, and/or composed of material(s) which minimize reflections of electromagnetic waves within the test range 1. In one non-limiting example, a concealment panel 53 may include absorbers 8. In preferred embodiments, the concealment panel(s) 53 is/are disposed substantially flush to the floor 5 of the test range 1. Substantially flush is understood to also include a flush arrangement.

Figure 6B:
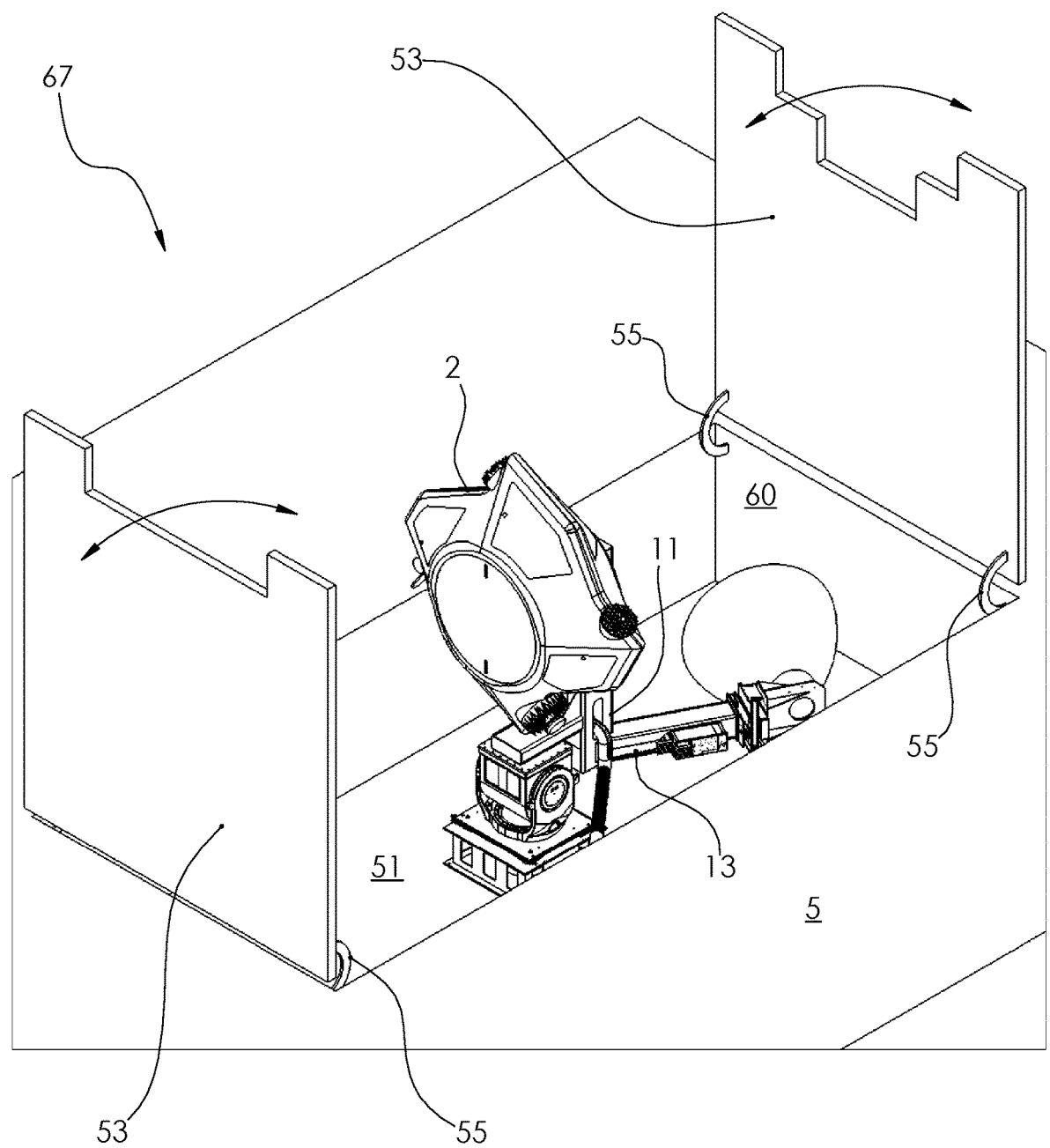
FIG. 6b is a perspective view illustrating concealment panels rotatably operable with respect to a feed source changer mounted within a pit whereby the panels in an OPEN position allow the feed source changer to rotate so as to vertically extend one arm and to horizontally stow another arm and whereby the panels in a CLOSED position minimize reflections from the stowed arm and mounting components within the pit in accordance with an embodiment of the invention.
Figure 6C:
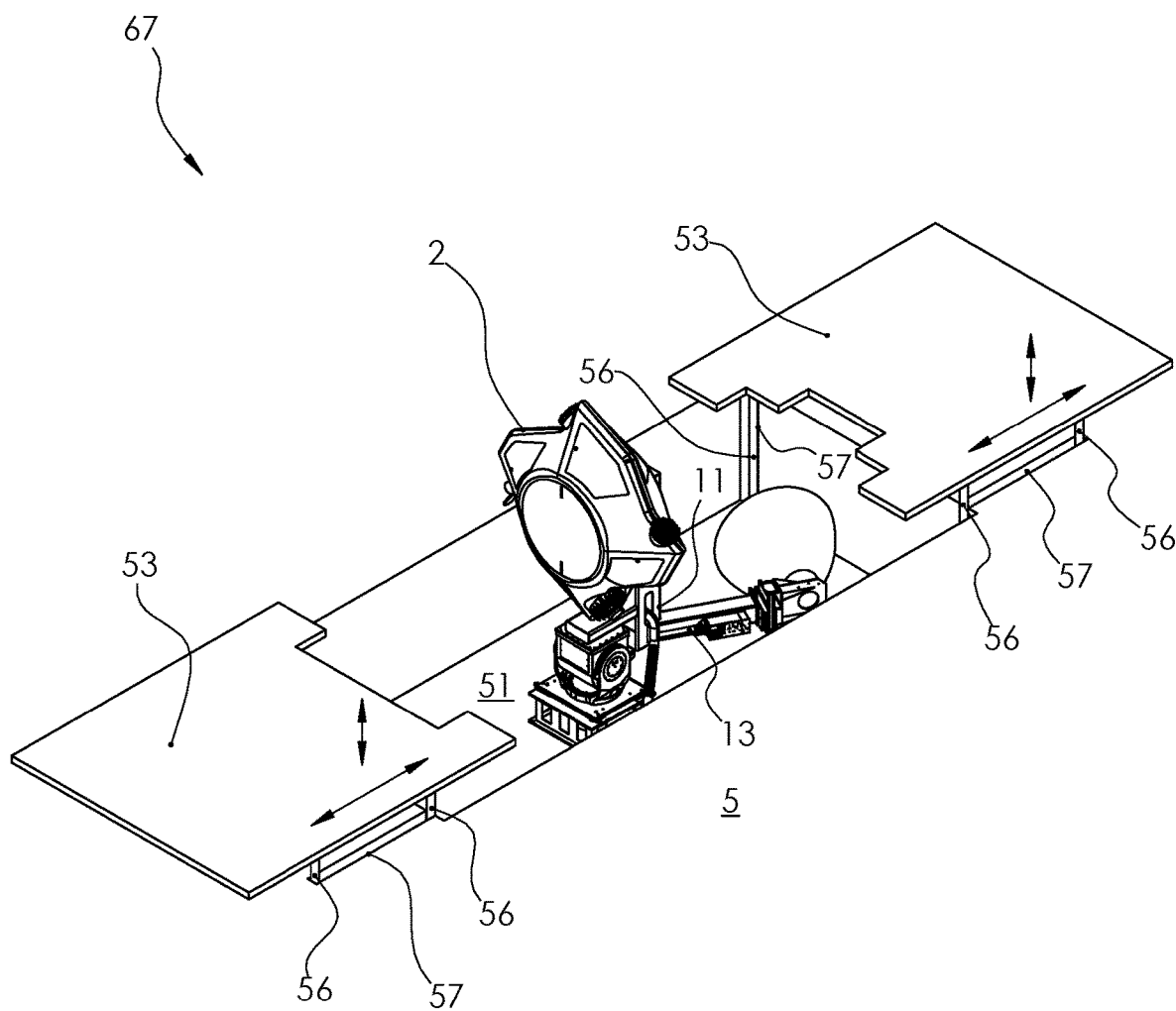
FIG. 6c is a perspective view illustrating concealment panels extendably and/or slidably operable with respect to a feed source changer mounted within a pit whereby the panels in an OPEN position allow the feed source changer to rotate so as to vertically extend one arm and to horizontally stow another arm and whereby the panels in a CLOSED position minimize reflections from the stowed arm and mounting components within the pit in accordance with an embodiment of the invention.

Referring now to FIGS. 6b and 6c, the design of the opening 61 adjacent to the feed source changer 2 disposed within a pit 51 may require the concealment panel(s) 53 of the concealment system 67 to be movable in some embodiments between an OPEN position when one arm 11 or 13 is rotated from horizontal to vertical and another arm 13 or 11 is rotated from vertical to horizontal and a CLOSED position when both arms 11, 13 are properly oriented.

Referring again to FIG. 6b, a concealment panel 53 may be attached to a wall 60 via actuator(s) 55 so as to allow rotational motion between the CLOSED position illustrated in FIG. 6a and the OPEN position illustrated in FIG. 6b. In preferred embodiments, rotational motion is relative to the floor 5. In some embodiments, the actuator(s) 55 may facilitate automated or powered rotational operability for opening and closing the concealment panel(s) 53. In other embodiments, the actuator(s) 55 may allow manually-enabled rotational operability for opening and closing the concealment panel(s) 53.

Referring again to FIG. 6c, a concealment panel 53 may be attached to actuator(s) 56 which are movable within a slot 57 so as to allow sliding motion between the CLOSED position illustrated in FIG. 6a and the OPEN position illustrated in FIG. 6c. In preferred embodiments, slidable motion includes movement by the concealment panel(s) 53 in a plane of or parallel to the floor 5. In some embodiments, the actuator(s) 56 may facilitate automated or powered sliding operability for opening and closing the concealment panel(s) 53. In other embodiments, the actuator(s) 56 may allow manually-enabled sliding operability for opening and closing the concealment panel(s) 53.

Referring again to FIG. 6c, a concealment panel 53 may be attached to actuator(s) 56 which are movable so as to allow extendable motion between the CLOSED position illustrated in FIG. 6a and the OPEN position illustrated in FIG. 6c. In alternate embodiments, the actuator(s) 56 may extend the concealment panel(s) 53 above a vertical arm 11, 13 and components attached thereto in the OPEN position. In preferred embodiments, extendable motion is understood to including raising and lowering the concealment panel(s) 53 relative to the floor 5. In some embodiments, the actuator(s) 56 may facilitate automated or powered extendable operability for opening and closing the concealment panel(s) 53. In other embodiments, the actuator(s) 56 may allow manually-enabled extendable operability for opening and closing the concealment panel(s) 53. Slidable functionality, extendable functionality, or both may be adapted to embodiments of the concealment system 67.

Figure 7:
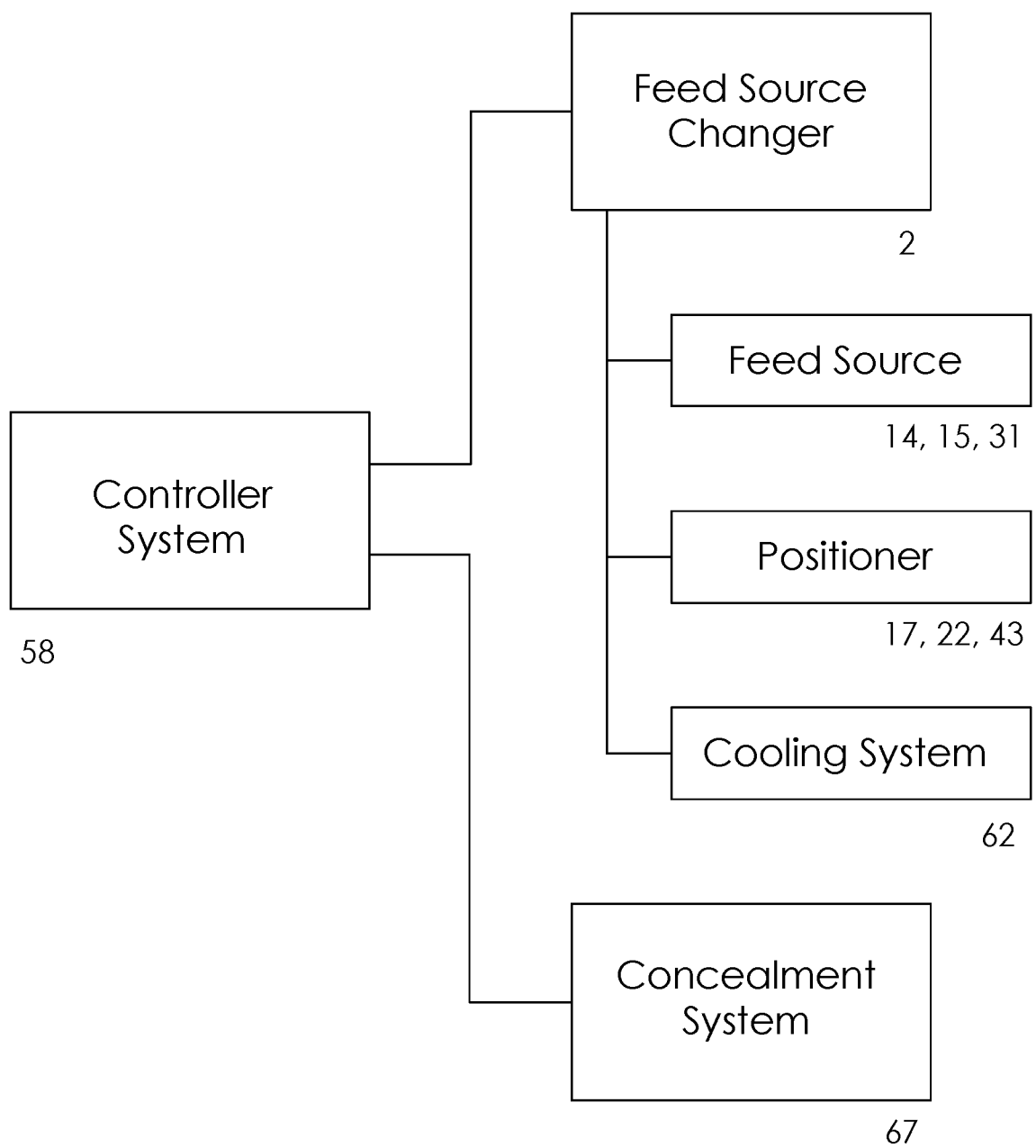
FIG. 7 is block diagram illustrating communication between a controller system and a feed source changer and a concealment system in accordance with an embodiment of the invention.

Referring now to FIG. 7, a controller system 58 operable via a user may communicate with the feed source changer 2 and/or the concealment system 67. The controller system 58 may send commands and/or information to and optionally receive commands and/or information from the feed source changer 2 for operability of the feed source(s) 14, 15, 31, the positioner(s) 17, 22, 43, and the cooling system 62, the latter including fan(s) 48 and/or sensor(s) 49. The controller system 58 may also send commands and/or information to and optionally receive commands and/or information from the actuator(s) 55, 56 within the concealment system 67.

As is evident from the explanation herein, the invention in its various embodiments is applicable to measurements appropriate for assessing the electromagnetic properties of a device under test, non-limiting examples including the radar cross section of an object or the reception characteristics of an antenna.

The description above indicates that a great degree of flexibility is offered in terms of the present invention. Although various embodiments have been described in considerable detail with reference to certain preferred versions thereof, other versions are possible. Therefore, the spirit and scope of the appended claims should not be limited to the description of the preferred versions contained herein.

What is claimed is:

1. A feed source changer for use within a test range comprising:
   (a) a pair of arms rotatable in use between a first orientation and a second orientation; and
   (b) an antenna wheel rotatably mounted to one of said arms, said antenna wheel includes a shroud disposed about a center body, at least two feed sources mounted to an outer side of said center body, each said feed source aligned along a rotational plane of said center body with each said feed source tangentially disposed with respect to said center body.

2. The feed source changer of claim 1, wherein each said feed source has a source point, said source point positionable to an activation point at which said feed source being properly located within said test range.

3. The feed source changer of claim 1, wherein a second antenna wheel mounted to other one of said arms.

4. The feed source changer of claim 1, wherein another said feed source fixed to other one of said arms.

5. The feed source changer of claim 1, wherein said arms arranged to define a first angle being perpendicular.

6. The feed source changer of claim 1, wherein said arms arranged to define a second angle being oblique.

7. The feed source changer of claim 1, further comprising:
   (c) an elevation positioner which rotates said arms within an elevational plane.

8. The feed source changer of claim 1, further comprising:
   (c) a rotation positioner which rotates said antenna wheel within said rotational plane.

9. The feed source changer of claim 1, further comprising:
   (c) a third arm with either a second antenna wheel or another said feed source thereon, said third arm and one of said arms rotatable within a plane which intersects an elevational plane within which said arms rotate.

10. The feed source changer of claim 1, further comprising:
    (c) an antenna positioner disposed between said feed source and said center body.

11. The feed source changer of claim 1, wherein said center body includes at least one plenum adapted to receive an airflow and a duct adapted to vent said airflow from said antenna wheel.

12. The feed source changer of claim 1, further comprising:
    (c) a fan adapted to move an airflow into and out of said antenna wheel.

13. The feed source changer of claim 1, further comprising:
    (c) a sensor adapted to measure a temperature of an airflow within said antenna wheel.

14. The feed source changer of claim 1, wherein said shroud adapted to mitigate electromagnetic reflections.

15. The feed source changer of claim 1, further comprising:
    (c) a base disposed between a floor and said arms, said arms rotatable with respect to said base.

16. The feed source changer of claim 1, wherein said feed source changer disposed within a pit.

17. The feed source changer of claim 1, wherein one said arm being at said first orientation when other said arm being at said second orientation.

18. The feed source changer of claim 1, wherein said first orientation being horizonal and said second orientation being vertical.

19. The feed source changer of claim 1, wherein one said arm fixed to other said arm.

20. The feed source changer of claim 1, wherein one said feed source extends through said shroud.

21. The feed source changer of claim 1, further comprising:
(c) a concealment panel disposed adjacent to said feed source changer, said concealment panel adapted to minimize an electromagnetic reflection from said feed source changer.

\* \* \* \* \*